United States Patent
Cotant et al.

(10) Patent No.: US 7,110,931 B2
(45) Date of Patent: Sep. 19, 2006

(54) ADVANCED ELECTRONIC SIGNAL CONDITIONING ASSEMBLY AND METHOD

(75) Inventors: Glen Cotant, Ramona, CA (US); Russell L. Machado, San Diego, CA (US)

(73) Assignee: Pulse Engineering, Inc., San Diego, CA (US)

( * ) Notice: Subject to any disclaimer, the term of this patent is extended or adjusted under 35 U.S.C. 154(b) by 602 days.

(21) Appl. No.: 10/096,605

(22) Filed: Mar. 12, 2002

(65) Prior Publication Data
US 2003/0042991 A1  Mar. 6, 2003

Related U.S. Application Data

(60) Provisional application No. 60/275,069, filed on Mar. 12, 2001.

(51) Int. Cl.
*G06F 17/50* (2006.01)
(52) U.S. Cl. .............................................. 703/14
(58) Field of Classification Search .............. 703/14
See application file for complete search history.

(56) References Cited

U.S. PATENT DOCUMENTS

| | | | |
|---|---|---|---|
| 5,097,215 A | | 3/1992 | Eul et al. |
| 5,490,082 A | | 2/1996 | Rowson |
| 5,544,071 A | | 8/1996 | Keren et al. |
| 5,875,111 A | | 2/1999 | Patel |
| 5,930,340 A | | 7/1999 | Bell |
| 5,991,522 A | | 11/1999 | Shoen |
| 6,002,722 A | * | 12/1999 | Wu .............................. 375/295 |
| 6,116,963 A | | 9/2000 | Shutter |
| 6,137,866 A | | 10/2000 | Staber et al. |
| 6,141,377 A | | 10/2000 | Sharper et al. |
| 6,144,735 A | | 11/2000 | Bella |
| 6,181,777 B1 | * | 1/2001 | Kiko ......................... 379/32.04 |
| 6,188,750 B1 | | 2/2001 | Kiko |
| 6,212,259 B1 | * | 4/2001 | Kiko ......................... 379/32.01 |
| 6,226,322 B1 | * | 5/2001 | Mukherjee .................. 375/229 |
| 6,404,347 B1 | | 6/2002 | Kiko |
| 6,826,265 B1 | * | 11/2004 | Bingel et al. ............ 379/93.01 |

OTHER PUBLICATIONS

J.C. Lai, J.S. Kueng, H.C. Chen and F.J. Fernandez, "ADOPT-A CAD Tool for Analog Circuit Design", IEEE 1988, pp. 29 & 30.*
U.S. Utility Patent Application Serial No. 09/661,628 filed Sep. 13, 2000 entitled "Advanced Electronic Microminiature Coil and Method of Manufacturing".
Atech Technology Co., Ltd.—POTS Splitter (Jul. 11, 2001).
Broadwire 120 High Density ADSL Splitter—Description—ADC Telecommunications (no date).
Linksys support pages regarding N. American Complex Impedance (348WW+100nF)//1330WW 336dB and European Complex Imedance 150 nF//750WW+270WW>13dB,>>9dB 4 filters (no date).

(Continued)

*Primary Examiner*—Paul L. Rodriguez
*Assistant Examiner*—Dwin M. Craig
(74) *Attorney, Agent, or Firm*—Gazdzinski & Associates

(57) ABSTRACT

An advanced electronic signal conditioning circuit and associated housing elements. In one embodiment, the circuit comprises a plurality of coupled inductors and capacitors arranged in a signal filtering configuration which achieves enhanced voice- and DSL-band performance through the use of complex-impedance modeling during the circuit design phase. Free-standing and fixed device housings are also disclosed. Methods for manufacturing the aforementioned components are also described.

21 Claims, 22 Drawing Sheets

OTHER PUBLICATIONS

ADSL POTS Microfilter CS-MF1 Quick Installation Guide (Nov. 19, 1999).

Committee T1—Telecommunications Contribution re: In-Line Filter Standard—T1E1.4/2000-110R6 (no date).

Compensation of Filter-to-Filter Interactions within Narrow Band Filter Assemblies: Application to Congested Spectrum Scenarios—RS Microwave—P/N 61491A-1 Antenna Interface Assembly (no date).

Atech ADSL CPE POTS Splitter for North America, Japan, Taiwan and China Marketing (no date).

2Wire, Inc.—Home Solutions, Adapters & Filters Internet Website Page (no date).

Siemens DAA2000 Application Note Circuit Variation for International Operation (Sep. 2, 1998).

Course Description—ECE 353 Radio Communication Circuits Spring Semester 2001.

Schematic of 2Wire, Excelsus and Suttle Filters (Feb. 2000).

* cited by examiner

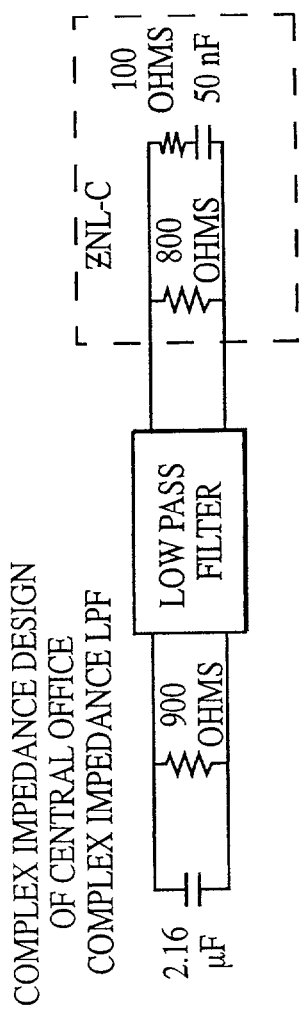

ADVANCED ELECTRONIC SIGNAL CONDITIONING ASSEMBLY AND METHOD

PRIORITY AND RELATED APPLICATIONS

This application claims priority benefit to U.S. provisional patent application Ser. No. 60/275,069 filed Mar. 12, 2001 entitled "Advanced Electronic Signal Conditioning Assembly And Method Of Manufacturing" which is incorporated herein by reference in its entirety. This application is also related to (i) U.S. design patent application Ser. No. 29/141,570 filed May 9, 2001 and entitled "Electronics Housing Elements"; and (ii) U.S. utility patent application Ser. No. 09/661,628 filed Sep. 13, 2000, and entitled "Advanced Electronic Miniature Coil and Method of Manufacturing", both also owned by the Assignee hereof and incorporated herein by reference in their entirety.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

The present invention relates generally to electronic signal conditioning elements and particularly to an improved design and method of manufacturing a signal filtering and conditioning assembly, which may be adapted for use in, inter alia, digital subscriber line (DSL) applications.

2. Description of Related Technology

With the increasing use of DSL (Digital Subscriber Line) and home networking technologies, it is often desirable to have DSL signals, home networking signals, or both present on a home telephone wiring network simultaneously with voice-band signals. Voice-band signals are commonly referred to as POTS (Plain Old Telephone Service) signals. Providing DSL service, home networking, and POTS over standard telephone lines permits the home telephone wiring network to operate effectively as a local area network (LAN), while at the same time permitting voice-band and DSL service to be transmitted across the home telephone wiring network.

Despite the advantages of providing DSL, home networking, and POTS signals simultaneously over a common home telephone wiring network, mechanisms are needed to prevent DSL and/or home networking signals from reaching voice-band/POTS appliances coupled to the home telephone wiring network. It is also desirable to prevent POTS device impedance effects from entering onto the home telephone wiring network and potentially degrading the transmission of DSL data signals. Voice-band appliances may include, for example, telephones, answering machines, facsimile machines, V.90 or similar modems, and the like. DSL or home networking signals may cause nonlinear behavior of the voice-band appliances to create noise into the POTS connection.

Voice-band appliances typically undergo impedance changes during operation. In one situation, it has been observed that the change of state from "on-hook" to "off-hook" of the telephone equipment and sometimes the telephone terminal equipment even being "on-hook" can create a resonance effect to occur so as to drop the impedance value to a comparatively low level, even at comparatively high frequencies. Preventing DSL and home networking signals from reaching voice-band appliances also protects the DSL and home networking transports from high-frequency intermodulation products of the voice-band appliances.

Second-order low-pass Butterworth filters are well known in the signal conditioning and filtration arts, and are commonly inserted between the home telephone wiring network and an associated POTS device to prevent DSL signals (e.g., ADSL signals), on the home telephone network from affecting the POTS device. These devices also act to prevent transient noise from POTS devices from interfering with the proper operation of a DSL modem coupled to the home network, and vice-versa.

The second-order Butterworth filter circuit is inherently asymmetrical and generally includes one coupled inductor (or two uncoupled inductors) and one capacitor. This design requires, for proper operation, that the filter be oriented between the POTS device and the home telephone wiring network such that the coupled inductor is disposed between the home telephone wiring network and the capacitor. If the capacitor is disposed adjacent to the home telephone wiring network, high frequency signals, such as DSL signals, on the home telephone wiring network are likely to short across the capacitor, thereby potentially interfering with the operation of the DSL modem.

Another disadvantage of conventional second-order Butterworth filter designs is that they often do not provide sufficient attenuation of DSL signals. For example, a typical second-order Butterworth filter may be designed with a low insertion loss throughout the pass band (including the POTS band) and has a cutoff frequency above the POTS signal band and below the ADSL transmission band (i.e. below about 20 kHz). The attenuation achieved at the higher ADSL frequencies is generally insufficient, and allows a significant amount of DSL transmit signal leakage through the filter, which can result in interference with the associated POTS device, particularly if the associated POTS device is a data device, such as a modem or facsimile machine.

The T1.421 In-Line Filter Standard of the Standards Committee T1 (Telecommunications) of the American National Standards Institute, also formerly the T1E1.4/2000-110 draft (hereinafter "Standard") is a standard relating to in-line filters used in the telephone and data communication industries for protection of typical POTS devices when high speed digital services (e.g., ADSL, G.lite, etc.) are deployed on the same telephone line. The Standard is intended to allow complete interoperability between vendors and reduce maintenance of POTS and related equipment. The Standard specifies a variety of specific performance objectives and criteria, including (i) reduced DC impedance through the filter; (ii) enhanced attenuation of higher frequency data signals in the voice band; (iii) the minimization of voice-band transmission effects for up to five (5) installed filters; and (iv) maintaining voice-band signal levels such that operation of currently deployed devices such as V.90 modems are not impaired.

Existing prior art approaches to signal conditioning and filtration (such as the aforementioned Butterworth circuits) fail to meet these more stringent objectives due in part to their less than optimal design process, which does not effectively account for complex impedances on the load and/or source end of the conditioning/blocking circuit(s).

Another desirable attribute of "consumer" filtration and conditioning circuits is low cost of production. Significant factors in determining the cost of producing a filter include (i) the number of components that make up the filter, and (ii) the relative cost and performance of the components used. In general, the higher the number of components that make up the filter, the higher the cost will be to produce the device. Obviously, more components can also impact the space required to accommodate the device, and can necessitate larger housings and internal PCBs. Consequently, it is desirable to keep the component count and component size of a given filter design low to keep the production cost low.

Based on the foregoing, a need exists to provide improved apparatus and methods for preventing signals from DSL and home network signal carriers from reaching voice-band appliances such as telephones, facsimile machines, and modems. Additionally, such improved apparatus would provide isolation of DSL devices and HPNA (Home Phoneline Network Alliance) standard devices from the impedance fluctuations of voice-band appliances. Ideally, such methods and apparatus would be easy and cost efficient to implement and manufacture, respectively. The apparatus would also exhibit enhanced electrical performance, such as for example compliance with more stringent performance standards such the previously described T1.421 standard.

SUMMARY OF THE INVENTION

In a first aspect of the invention, an improved signal conditioning circuit useful for, inter alia, digital subscriber line applications is disclosed. In one exemplary embodiment, the circuit comprises a complex-impedance device having a plurality of coupled inductors and capacitors arranged in pairs in order to selectively filter and condition signals in digital subscriber line applications. The circuit provides enhanced frequency performance and reduced DC resistance through use of various attributes relating to its complex-impedance modeling.

In a second aspect of the invention, an improved method of manufacturing the aforementioned signal conditioning circuit is disclosed. The method generally comprises performing a complex modeling of the electrical performance of the circuit and associated load and/or source components circuit using at least one modeling computer program, and selecting the components and values thereof based on the results of such complex modeling.

In a third aspect, an improved device portable housing assembly is disclosed. In one exemplary embodiment, the device housing comprises a contoured multi-part element adapted to be freely suspended from its cable, the latter physically (and electrically) connecting the device to a corresponding wall jack.

In a fourth aspect of the invention, an improved electronics assembly is disclosed. In one exemplary embodiment, the assembly comprises a unitary substrate (e.g., PCB) with the aforementioned signal conditioning circuitry disposed thereon, and adapted to be received substantially within the aforementioned portable housing. The assembly further includes two modular jacks which provide signal conditioning with and without filtering.

In a fifth aspect of the invention, an improved device fixed housing assembly is disclosed. In one embodiment, the device housing comprises a wall mounted jack assembly having the aforementioned signal conditioning circuit disposed at least partly therein. A plurality of modular jacks are disposed on various ones of the external faces of the assembly.

In a sixth aspect, an improved DSL filter device comprising the aforementioned signal conditioning circuit and housing element is disclosed.

In a seventh aspect, an improved computer program useful for designing and manufacturing the aforementioned signal conditioning circuit is disclosed. In one exemplary embodiment, the computer program comprises a source code listing reduced to an object code representation disposed on a storage medium for use in a micro-computer system.

BRIEF DESCRIPTION OF THE DRAWINGS

The features, objectives, and advantages of the invention will become more apparent from the detailed description set forth below when taken in conjunction with the drawings, wherein:

FIG. 3b is a top plan view of an exemplary circuit assembly incorporating the circuit of FIG. 3a.

FIGS. 11a–b are block diagrams illustrating one exemplary embodiment of the complex modeling of the signal conditioning circuit of the present invention (as used in the application of FIG. 11) as compared to a typical prior art approach.

DETAILED DESCRIPTION OF THE PREFERRED EMBODIMENT

Reference is now made to the drawings wherein like numerals refer to like parts throughout.

It is noted that while portions of the following description are cast primarily in terms of a plurality of RJ-type connectors and associated modular plugs of the type well known in the art, the present invention may be used in conjunction with any number of different connector types. Accordingly, the following discussion of the RJ plugs is merely exemplary of the broader concepts.

As used herein, the terms "electrical component" and "electronic component" are used interchangeably and refer to components adapted to provide some electrical function, including without limitation inductive reactors ("choke coils"), transformers, filters, gapped core toroids, inductors (coupled or otherwise), capacitors, resistors, operational amplifiers, and diodes, whether discrete components or integrated circuits, whether alone or in combination. For example, the improved toroidal device disclosed in Assignee's co-pending U.S. patent application Ser. No. 09/661,628 entitled "Advanced Electronic Microminiature Coil and Method of Manufacturing" filed Sep. 13, 2000, which is incorporated herein by reference in its entirety, may be used in conjunction with the invention disclosed herein.

As used herein, the term "signal conditioning" or "conditioning" shall be understood to include, but not be limited to, signal voltage transformation, blocking, filtering, current limiting, sampling, processing, and time delay.

As used herein the term "digital subscriber line" (or "DSL") shall mean any form of DSL configuration or service, whether symmetric or otherwise, including without limitation so-called "G.lite" ADSL (e.g., compliant with ITU G.992.2), RADSL: (rate adaptive DSL), VDSL (very high bit rate DSL), SDSL (symmetric DSL), SHDSL or super-high bit-rate DSL, also known as G.shdsl (e.g., compliant with ITU Recommendation G.991.2, approved by the ITU-T February 2001), HDSL: (high data rate DSL), HDSL2: (2nd generation HDSL), and IDSL (integrated services digital network DSL), as well as In-Premises Phoneline Networks (e.g., HPN).

It will further be recognized that while the terms "home" and "consumer" may be used herein in association with one or more aspects and exemplary embodiments of the invention, the invention is in no way limited to such applications. The present invention may be applied with equal success in, inter alia, small or large business, industrial, and even military applications if desired.

Lastly, the terms "wall", "wall mount" and "fixed" as used with respect to the housing elements described herein are in no way meant to be limited to walls or other vertical surfaces such as might be found in a dwelling or office. Rather, these terms are merely descriptive of a fixed or removably-fixed placement of the housing on some other structure, whether that structure moves in relation to its surroundings or not.

Signal Conditioning Circuit

Figure 1:
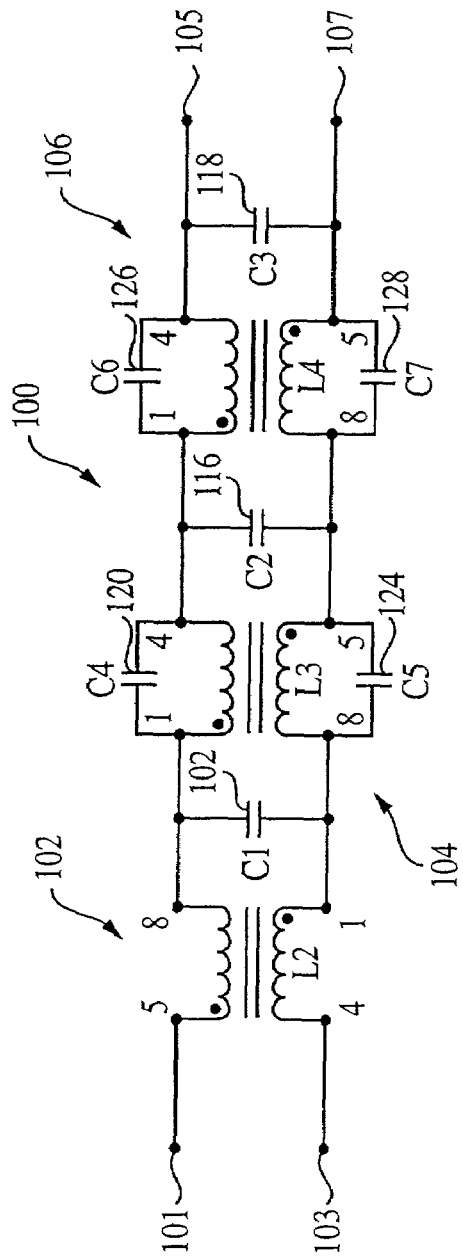
FIG. 1 is a schematic of a first embodiment of the signal conditioning circuit of the invention.
Figure 1A:
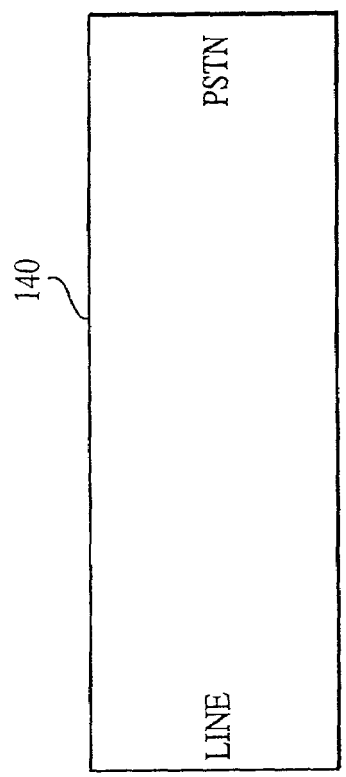
FIGS. 1a–1c are top, side, and end views of an exemplary embodiment of a signal conditioning circuit package incorporating the circuit of FIG. 1.
Figure 1D:
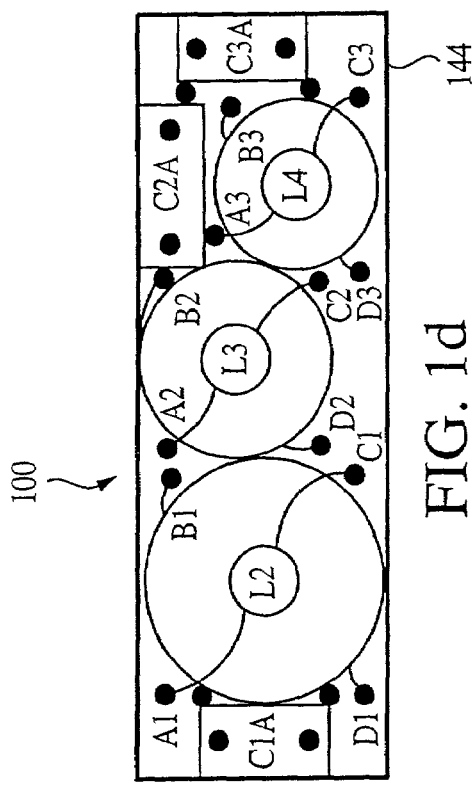
FIG. 1d is a top plan view of the interior portions of the circuit package of FIGS. 1a–1c, illustrating the layout of the various circuit components therein.
Figure 1B:
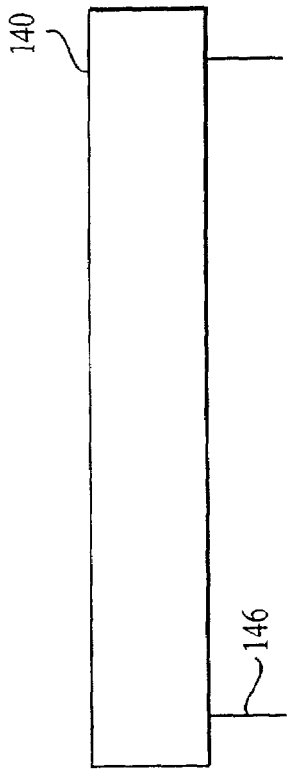
Figure 1C:
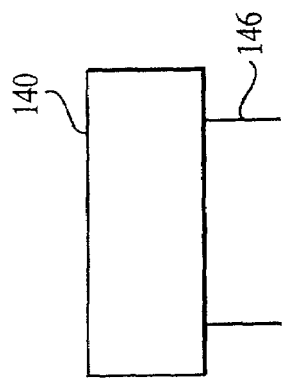

FIG. 1 is a schematic of a first exemplary embodiment of the signal conditioning circuit of the invention. As shown in FIG. 1, the circuit 100 comprises a plurality of inductive coupled elements 102, 104, 106 (coupled via the magnetically permeable core elements 108, 110, 112) and capacitive elements 114, 116, 118, 120, 124, 126, 128 arranged between two line-side nodes 101, 103 and two device-side nodes 105, 107. As used herein, the terms "line-side" and "device-side" are merely descriptive of two nodes (or sets of nodes) at either end of the circuit, and are in no way limiting as to the types or particular configurations of devices that may be attached to either side.

In the illustrated embodiment, the inductive elements 102, 104, 106 comprise coupled gapped toroid inductors as detailed in the aforementioned co-pending U.S. patent application Ser. No. 09/661,628 entitled "Advanced Electronic Microminiature Coil and Method of Manufacturing" filed Sep. 13, 2000. These gapped toroid devices are spatially compact and highly cost-efficient to produce, thereby allowing the resulting circuit size and cost of production to be reduced, respectively. The cost efficiency of these devices stems largely from their construction and manufacturing methods; specifically, multiple layers of uninsulated windings are separated by an insulating layer (e.g., Parylene) and tightly wound around a gapped toroidal core, thereby obviating the need for larger, insulated conductors and complex shaped magnetics and housings.

In the alternative, it will be recognized that coupled inductors having "shaped" magnetics (e.g., drum core type) adapted to accommodate the comparatively higher DC bias current generated by the circuit during operation may be used. Yet other configurations can be used as well, such as micro-toroids such as those described above yet which are not gapped. Additionally, the various types of devices can be mixed within the circuit. The capacitive elements of the present embodiment comprise metallized film capacitors of the type known in the art (chosen for good performance, compactness, and low cost), although other types of capacitors or even other devices having the desired capacitive properties may be substituted. Component inductance and capacitance values useful with the exemplary embodiment of FIG. 1 are provided thereon, although it will be recognized that other values may be used depending on the particular application.

The windings of a portion of the inductive elements 104, 106 are arranged in parallel with each of four of the capacitive elements 120, 124, 126, 128. Three other capacitors 114, 116, 118 are interposed between the two parallel electrical pathways 130, 132 of the respective coupled inductors. This arrangement produces a low-pass filter circuit adapted to filter noise at higher frequencies with optimal performance. As will be described in greater detail below, such optimal performance includes reduced DC resistance (<20 ohms in illustrated exemplary embodiment) with matched impedance.

FIGS. 1a–1d illustrate one exemplary embodiment of the circuit 100 of FIG. 1, shown disposed in a multi-pin surface mount package 140. Inside the package 140 (FIG. 1d), the circuit 100 is disposed. Three toroidal-core inductors 102, 104, 106 of the type previously described are disposed on a substrate 144, as are three 114, 116, 118 of the seven capacitive elements. The remaining four capacitive elements are disposed on the other side of the substrate 144 (not shown). The substrate 144 with components is disposed within the formed housing which, in the illustrated case, may comprises a molded epoxy casing, although other approaches for encasing or housing the substrate may be used. Terminal pins 146 project from the substrate 144 downward to mate with an external device (e.g., PCB).

Figure 2:
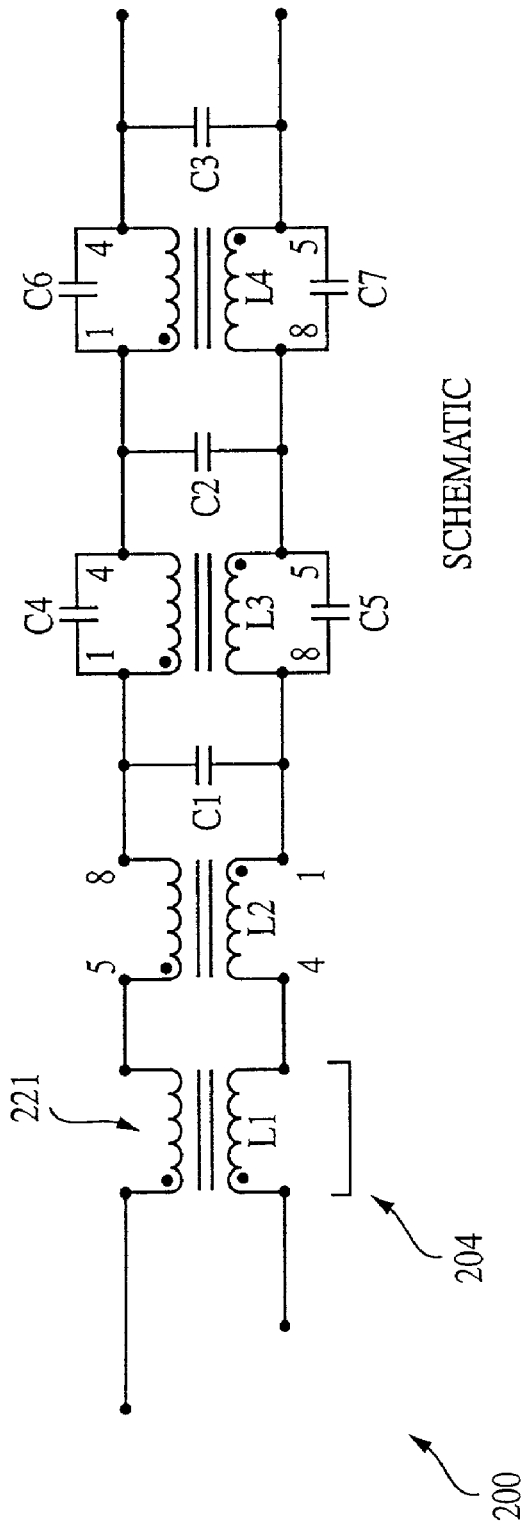
FIG. 2 is a schematic of a second embodiment of the signal conditioning circuit of the invention.

FIG. 2 is a schematic of a second embodiment of the signal conditioning circuit 200 of the invention, wherein an additional coupled inductor 221 comprising a common mode choke coil is inserted in the first stage 204 of the circuit. The common mode choke impedes radio station transmissions, CB radio transmissions and inductively coupled power surge disturbances.

Figures 2A, 2B:
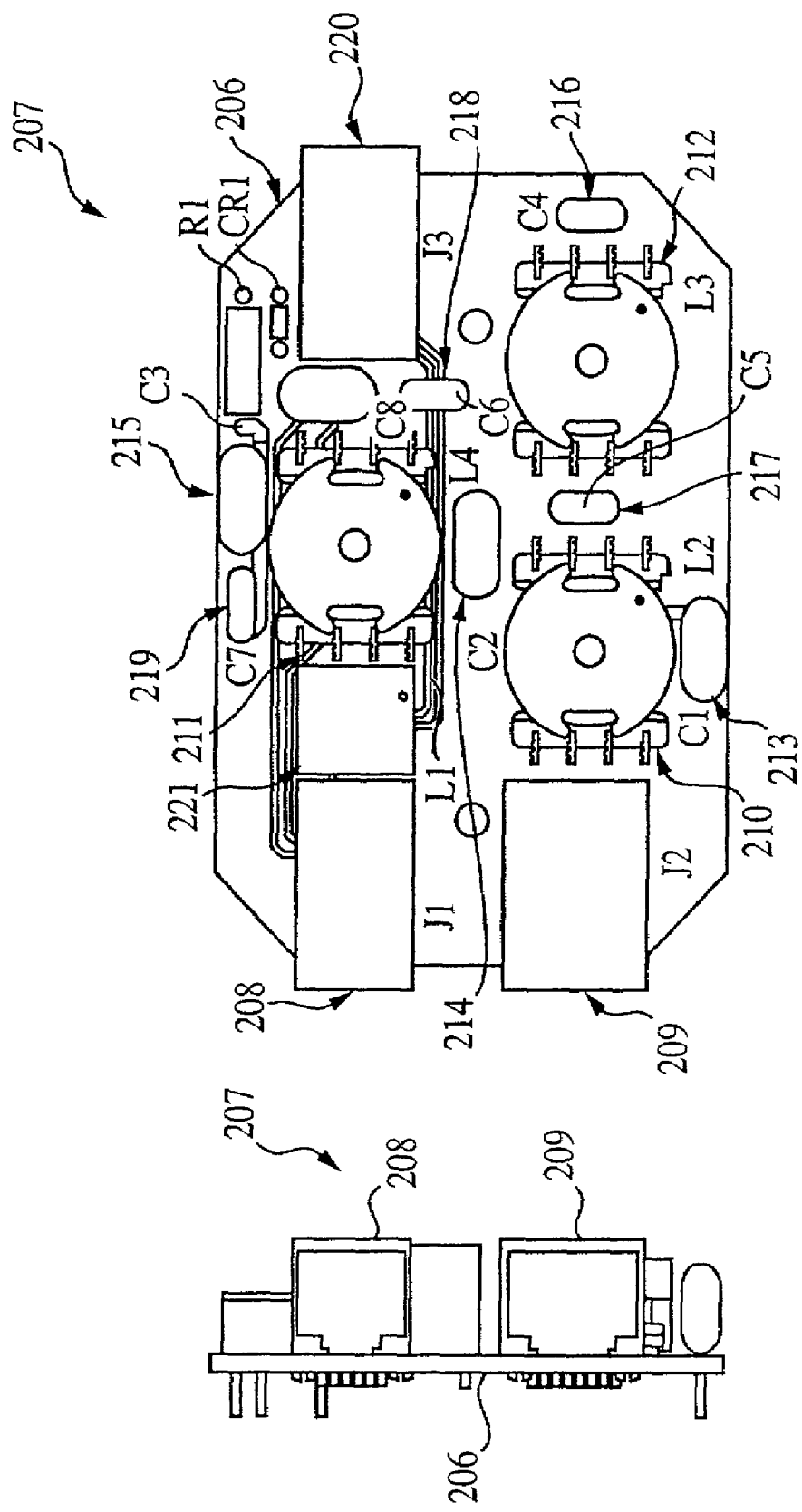
FIGS. 2a–2b are left-side and top plan views, respectively, of a circuit assembly incorporating the signal conditioning circuit of FIG. 2.

Referring now to FIGS. 2a and 2b, one embodiment of a circuit assembly incorporating the circuit of FIG. 2 is disclosed. In general, the assembly 207 comprises the filter circuit components including three coupled inductors 210–212, seven capacitors 213–219, and one common mode choke device 221 mounted on a substrate (e.g., PCB) 206 with corresponding phone and modem jacks 208, 209 and the line-side modular jack 220 disposed within the portable device housing (not shown). The phone and modem jacks 208, 209 of the illustrated embodiment are RJ-11 and RJ-45 type, respectively, although it will be appreciated that other combinations may be used. The line-side jack 220 is also RJ-11 type in this configuration. The modem and phone jacks 208, 209 are disposed in generally parallel orientation on one side of the device to facilitate easy connection by the user thereto, although other arrangements may be used. The modem jack is unfiltered, as in the configuration of FIG. 8 described subsequently herein.

The circuit components 208, 209, 210, 211, 212, 213, 214, 215, 216, 217, 218, 219, 220, 221 may be adhered to the PCB (such as via an adhesive suitable for the purpose), and/or bonded via their electrical terminals (such as by using a eutectic solder of the type well known in the electrical arts). The components 208, 209, 210, 211, 212, 213, 214, 215, 216, 217, 218, 219, 220, 221 are disposed on the PCB 206 in a compact and orderly arrangement which economizes on space, thereby allowing the housing to be smaller. Silicone encapsulant (not shown) is also optionally applied on and/or between the components to provide a more rugged and shock-resistant assembly. It will be recognized, however, that such encapsulant is optional, and in fact other materials (such as epoxies of the type well known in the surface mount art) may be substituted or used in combination.

It will be further recognized that that assembly 207 of FIGS. 2a–2b can be readily configured with the circuit of FIG. 1, or any other circuit, as well.

Figure 3A:
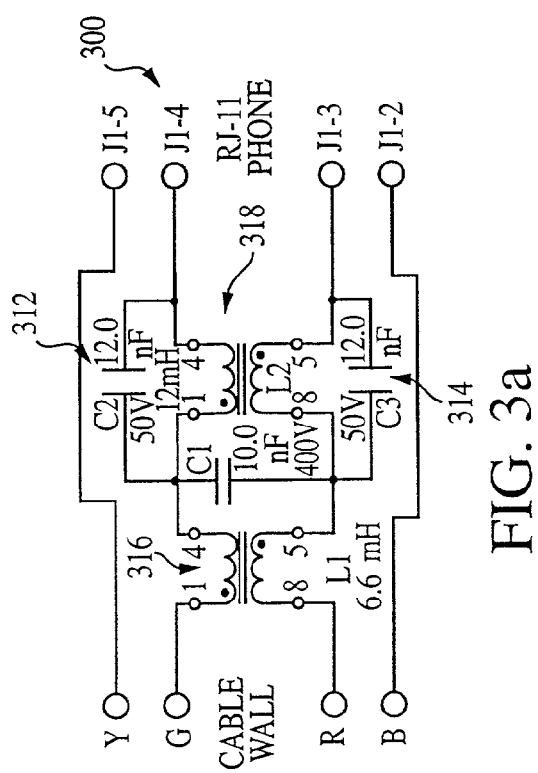
FIG. 3a is a schematic of one exemplary embodiment of the signal conditioning circuit used in conjunction with the portable housing device of the present invention.

FIGS. 3a–4b illustrate another embodiment of the signal conditioning circuit used in conjunction with the portable housing device of the present invention (described in greater detail below). Specifically, as shown in FIG. 3a, the filter circuit 300 is disposed between the wall unit (jack) 302 and the RJ-type (e.g., RJ-11 or RJ-45) telephone line modular plug 304. The circuit 300 in this embodiment comprises a pair of coupled inductors 301, 303, and three capacitive elements 302, 304, 306 disposed in the configuration of FIG. 3a. Component values are as shown in FIG. 3a. This embodiment has the advantage of great simplicity and ultra-low cost, while still maintaining a high level of performance. However, unlike the embodiments of FIGS. 1 and 2 previously described, this circuit 300 may be limited in terms of meeting very stringent performance requirements, and therefore may not be suitable for all applications.

Figure 3B:
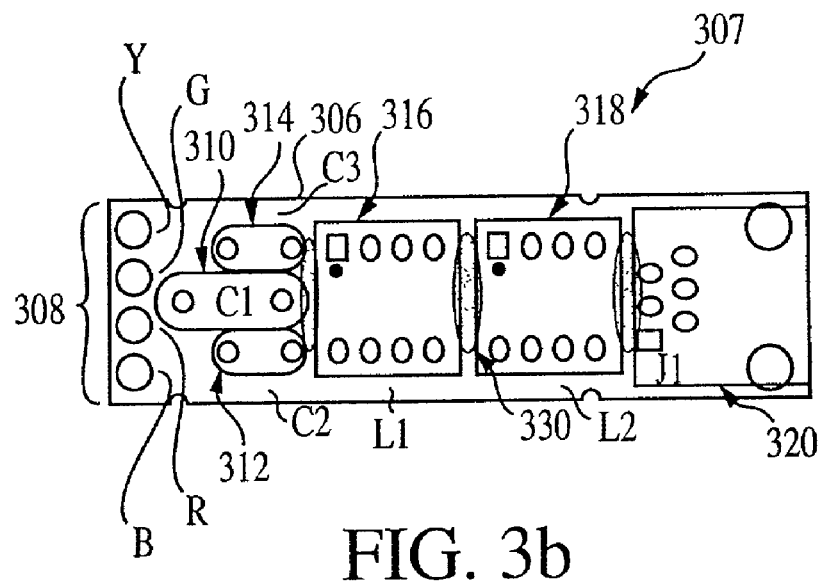
Figure 3C:
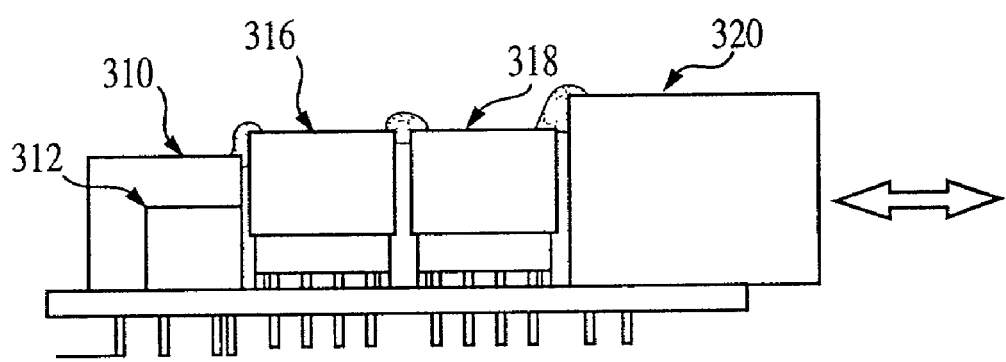
FIG. 3c is a side plan view of the circuit assembly of FIG. 3b.

FIGS. 3b and 3c illustrate the general arrangement of the filter circuit components mounted on a substrate (e.g., PCB) 306 with corresponding wall-side line terminals 308 and device-side modular jack 320 disposed within the portable device housing, thereby forming an assembly 307. The circuit components 310, 312, 314, 316 318, 320 may be adhered to the PCB (such as via an adhesive suitable for the purpose), and/or bonded via their electrical terminals (such as by using a eutectic solder of the type well known in the electrical arts). The components 308, 310, 312, 314, 316 318, 320 are disposed on the PCB 306 in a compact and orderly arrangement which economizes on space, thereby allowing the housing to be smaller. Silicone encapsulant 330 is also optionally applied on and/or between the components to provide a more rugged and shock-resistant assembly, especially in light of the potential use of the assembly by consumers and office workers who do not always delicately handle electronics. Such enhanced rugged construction is to some degree further dictated in the case of the in-line filter, since it is by design "free-floating", and hence subject to rapid acceleration/deceleration based on its use in a largely unrestrained telephone or data cable. It will be recognized, however, that such encapsulant is optional, and in fact other materials (such as epoxies of the type well known in the surface mount art) may be substituted or used in combination.

Figure 4A:
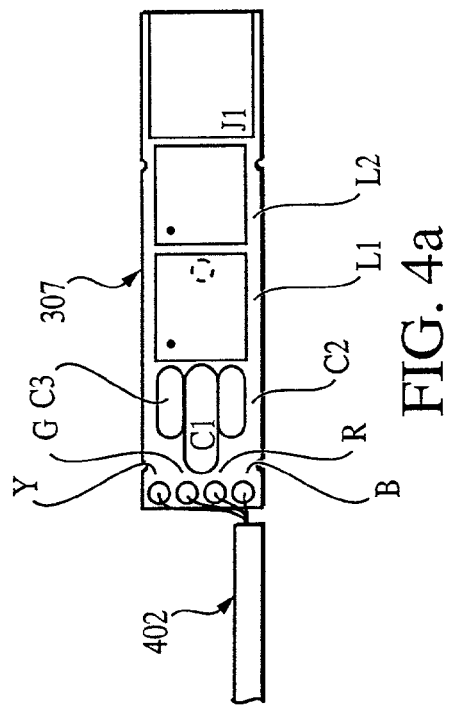
FIG. 4a is a top plan view of the circuit assembly of FIG. 3b, showing connection of the cable to the PCB terminals.
Figure 4B:
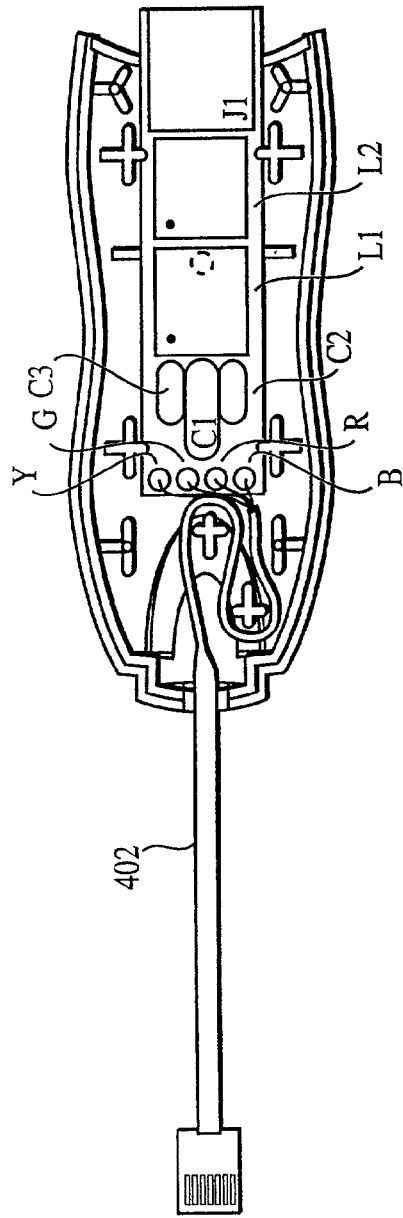
FIG. 4b is a top plan view of the circuit assembly of FIGS. 3b and 4a disposed in the exemplary portable housing device of FIG. 5.

Table 1 provides a summary of electrical performance specifications for the exemplary embodiment of FIGS. 3–4b. Appendix I provides detailed electrical performance data for the exemplary conditioning circuit of FIGS. 3–4b.

TABLE 1

| Parameter | Specification |
| --- | --- |
| 1 kHz insertion loss per T1E1.4 standard: | |
| Single filter- | 0.2 dB MAX |
| With 5 filters- | 0.2 dB MAX |
| 1 kHz/4 kHz distortion per T1E1.4 standard: | |
| Single filter- | 0.2 dB MAX |
| With 5 filters- | 1.6 dB MAX |
| Off-Hook High Band Stopband Attenuation | |
| Single filter- | 23 dB MIN |
| Total DC Resistance: | 20 Ω MAX |
| Tip to Ring- | 10 MΩ MAX |
| Longitudinal Balance: | |
| 200 Hz–1 kHz- | −65 dB MIN |
| 1 kHz–3 kHz- | −56 dB MIN |
| Complex * Return Loss with ATU-R: | |
| 200 Hz- | −20 dB MIN |
| 600 Hz- | −15 dB MIN |
| 1 kHz- | −15 dB MIN |
| 2.2 kHz- | −10 dB MIN |

*Based on exemplary 1330 Ω resistance in parallel (with 100 nanofarad capacitor in series with 348 Ω)

The method of assembling the circuit assembly 307 is now described with respect to FIG. 3d. First, the substrate 308 is fabricated, including terminals 308 (step 3622). The substrate in the illustrated embodiment comprises a printed circuit board (PCB) which can be readily made or purchased if desired. The terminals 308 are disposed in an array 309 at one end of the substrate 308 for use as described subsequently herein. Next, the electrical leads of the components 310, 312, 314, 316, 318, 320 are inserted into corresponding apertures in the PCB per step 364. The components are then soldered to the PCB terminals surrounding the apertures per step 366. Alternatively, the component terminals are prepared and bonded to corresponding terminal pads on the PCB (not shown) if component surface-mounting is utilized. The encapsulant 330 is then optionally applied and cured per step 368. Next, the leads of the cable 402 are terminated to their corresponding PCB terminals 308 per step 370 (FIG. 4*a*). The assembly 307 is then disposed within the housing 502 as shown in FIG. 4*b* (step 372). Lastly, the housing is assembled per step 374, and the device tested (step 376).

Portable Housing

Figure 5:
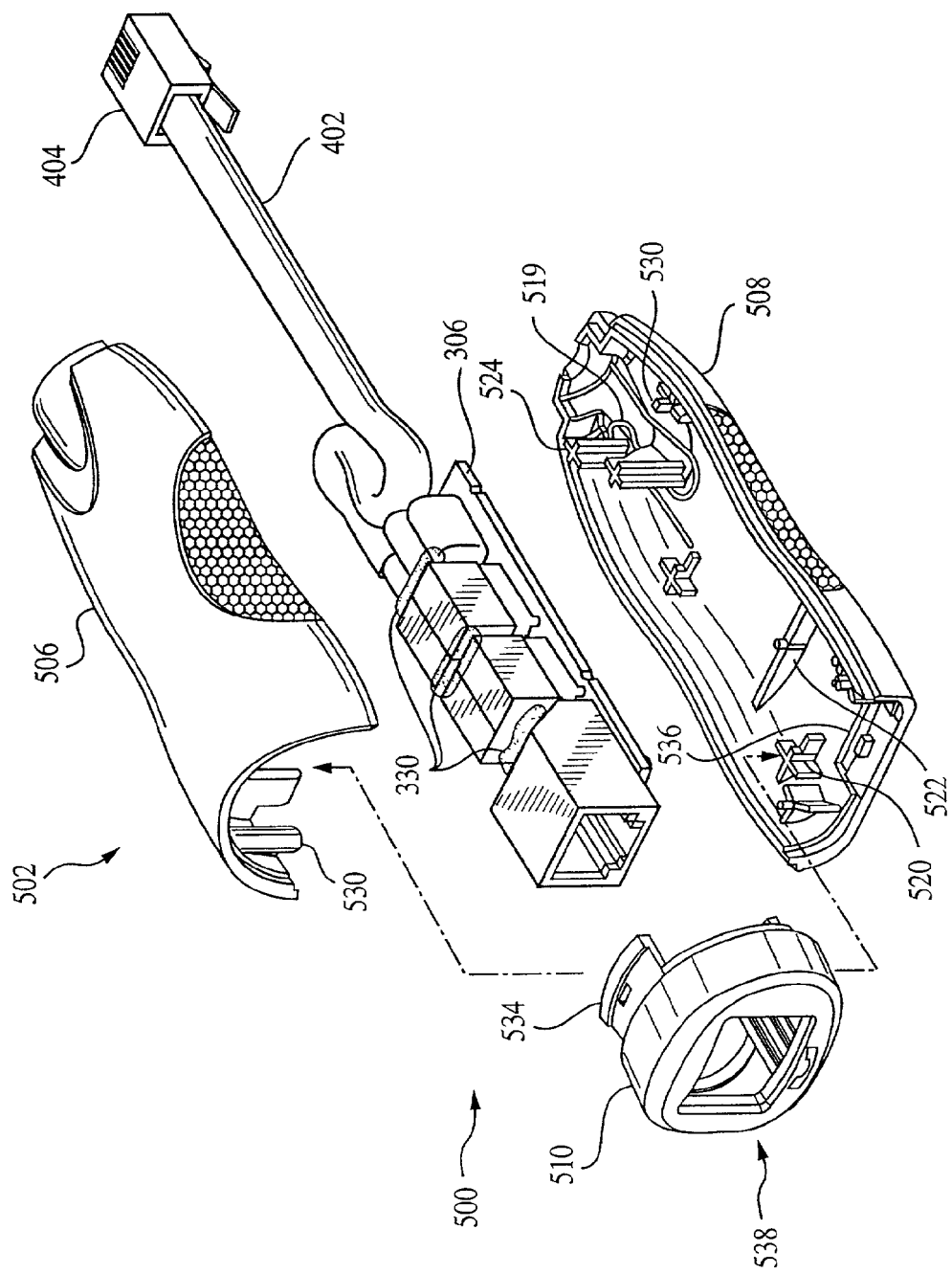
FIG. 5 is an exploded perspective view of one embodiment of the portable device housing of the invention, including signal conditioning circuit of FIGS. 3a–4b.
Figure 6C:
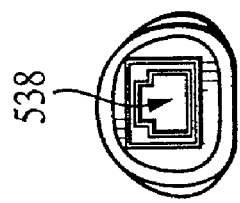
FIGS. 6a–6c are top, side, and front plan views of the assembled device housing of FIG. 5.
Figure 6A:
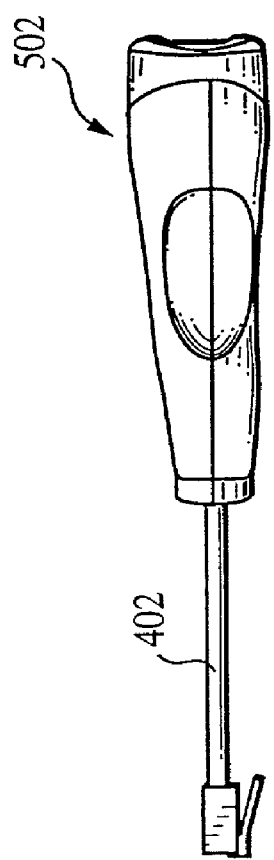
Figure 6B:
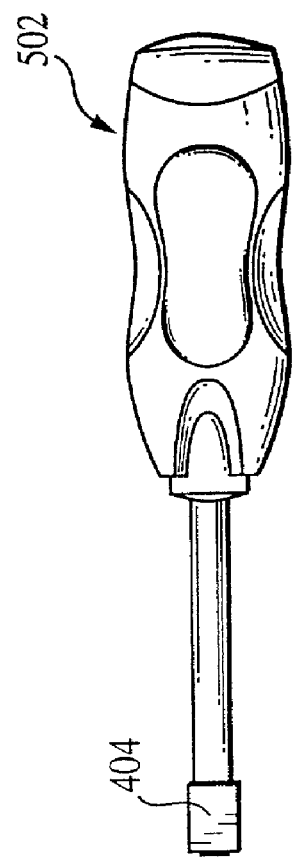

Referring now to FIGS. 5–7, the portable housing for use with the previously described signal conditioning circuits is disclosed. FIG. 5 is an exploded perspective view of one exemplary embodiment of the portable device 500 of the invention, including housing 502 and signal conditioning circuit assembly 307. FIGS. 6*a*–6*c* provide side, top, and front plan views of the housing 502, respectively. It will be recognized that while the housing 502 is shown with the circuit assembly 307 previously described, any number of different circuits and/or assembly configurations may be utilized with proper adaptation, such adaptation being well within the skill of the ordinary artisan.

The housing 502 of FIGS. 5 and 6*a*–*c* comprises three primary components, namely a top housing element 506, bottom housing element 508, and front element 510. The top and bottom elements 506, 508 are designed to fit together as shown in FIG. 5, with the circuit assembly 307 being captured in the interior volume created thereby. The bottom housing includes, inter alia, PCB locating tabs 520, PCB support/contact tabs 522, a plurality of strain relief posts 524 for relieving the cable strain generated during use, an a molded-in visual routing guide 519 for the cable 402. The PCB 306 of the illustrated embodiment also includes a plurality of notches 517 formed therein to cooperate with corresponding ones of the PCB locating tabs 520, thereby maintaining the PCB and circuit assembly 307 in rigid position within the housing 502 when assembled.

In the present embodiment, the housing elements 506, 508, 510 fit together in a frictional "snap-fit" fashion prior to ultrasonic welding, thereby obviating hardware and labor associated with other techniques. It will be recognized that while ultrasonic welding techniques of the type well known in the art are used, other techniques of bonding (such as adhesives, etc.) may be used in place of or in conjunction with the ultrasonic welding. Alternatively, the ultrasonic welding/bonding can be deleted, thereby allowing the device 500 to be disassembled if desired. Specifically, frictional post arrangements 530 of the type known in the art are used to maintain the upper and lower elements 506, 508 together.

The front element 510 snaps into the assembled housing elements 506, 508 as shown in FIG. 5, with the tabs 534 of the front element 510 being received in corresponding grooves 536 formed in the interior surfaces of the upper and lower housing elements 506, 508. The port 538 in the front element 510 permits access to the modular (e.g., RJ-type) disposed on the PCB in the circuit assembly 307.

When the modular plug from the telephone (or other equipment) line is received within the connector 320 and port 538 of the device 500, and the modular plug 404 of the device 500 is received within the corresponding wall jack (not shown), the signal conditioning device 500 "floats" substantially free, such that its position with respect to the wall jack and connected equipment may advantageously be substantially altered while maintaining electrical connection therewith. The housing 502 of the illustrated embodiment is advantageously made of lightweight polymeric material (e.g., injection molded plastic of the type well known in the art) to reduce both the "suspended" mass and the cost of the device 500.

It will be recognized, however, that other materials and housing configurations may be utilized for one or more elements of the housing if desired, depending on the particular needs. For example, the housing 502 can be fabricated from clear plastic for aesthetic purposes and/or to allow inspection of the interior volume and components. As yet another alternative, the cable 402 and associated modular plug 404 can be replaced with a second modular jack (RJ-type or otherwise), thereby allowing the user to insert modular plugs into both ends of the device.

Figure 7B:
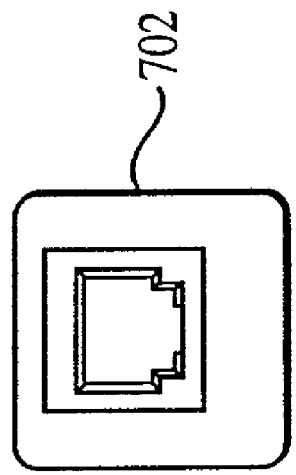
FIGS. 7a–7b are side and end plan views a second embodiment of the portable device housing (and filter circuit) of the invention.
Figure 7A:
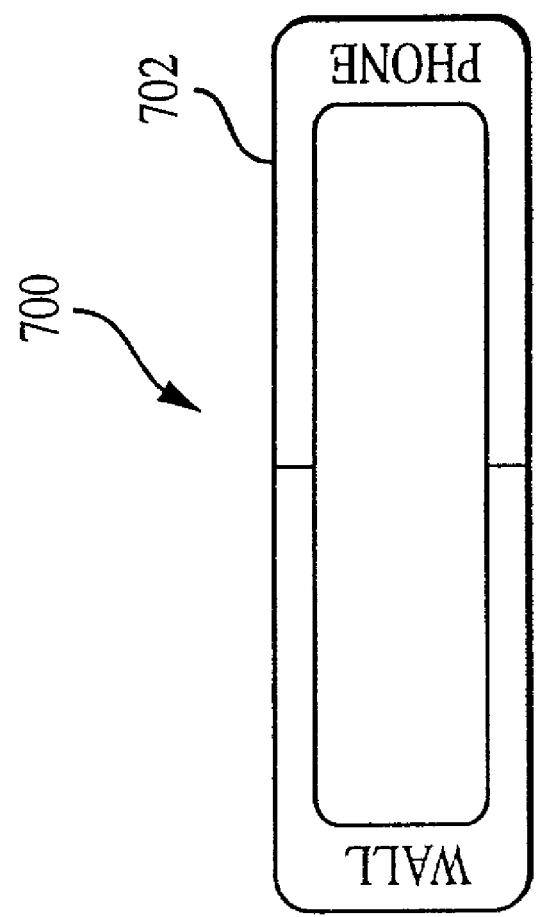

FIGS. 7*a*–7*b* shows yet another alternative embodiment of the device 700 of the present invention, having the aforementioned "dual-jack" configuration disposed within a substantially rectangular box-like housing 702. The two modular plug connectors are disposed within the housing on the substrate (not shown).

Fixed (e.g., Wall Mount) Housing and Circuit

Figure 8:
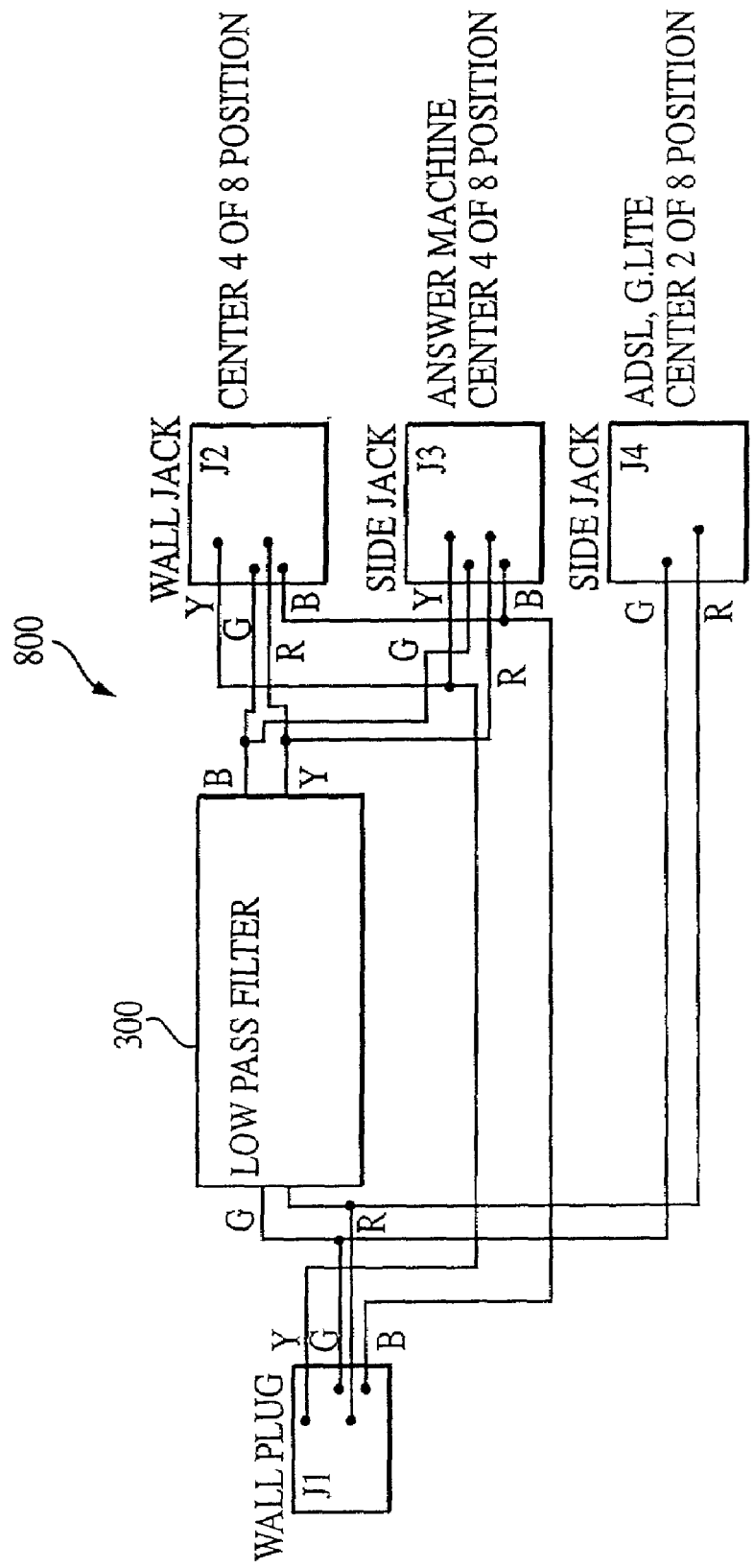
FIG. 8 is a functional block diagram (and wiring diagram) for a wall-mounted embodiment of the filter circuit of the invention.
Figure 9C:
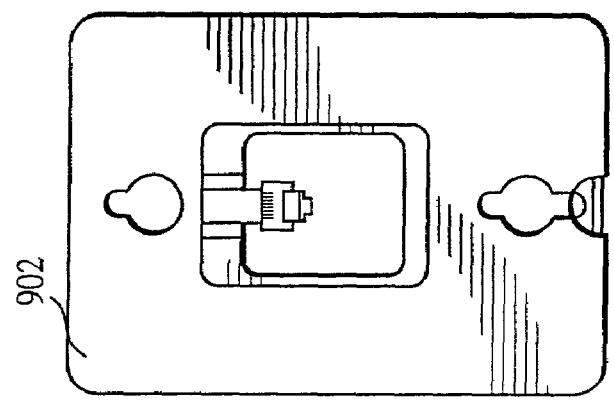
FIGS. 9a–c are front, side, and rear plan views of the wall mount device housing and filter circuit of the invention.
Figure 9B:
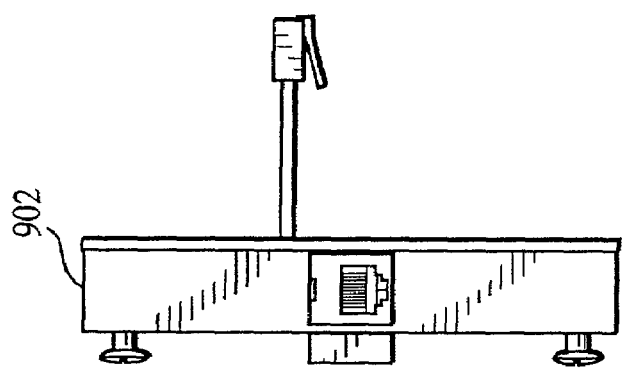
Figure 9A:
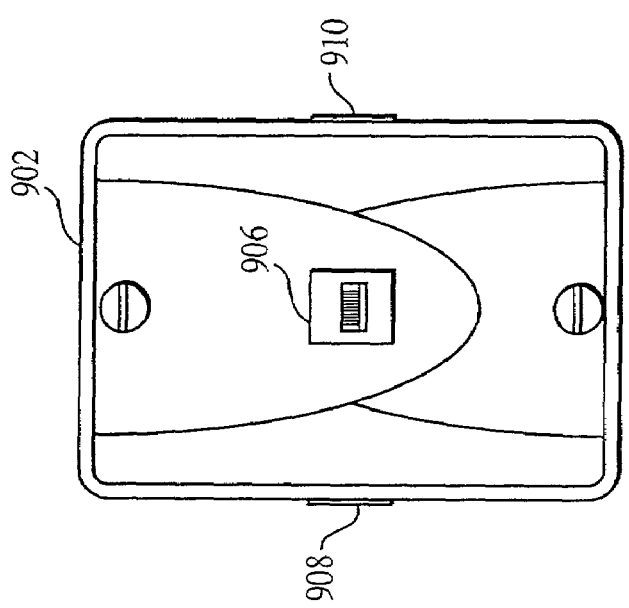
Figure 10:
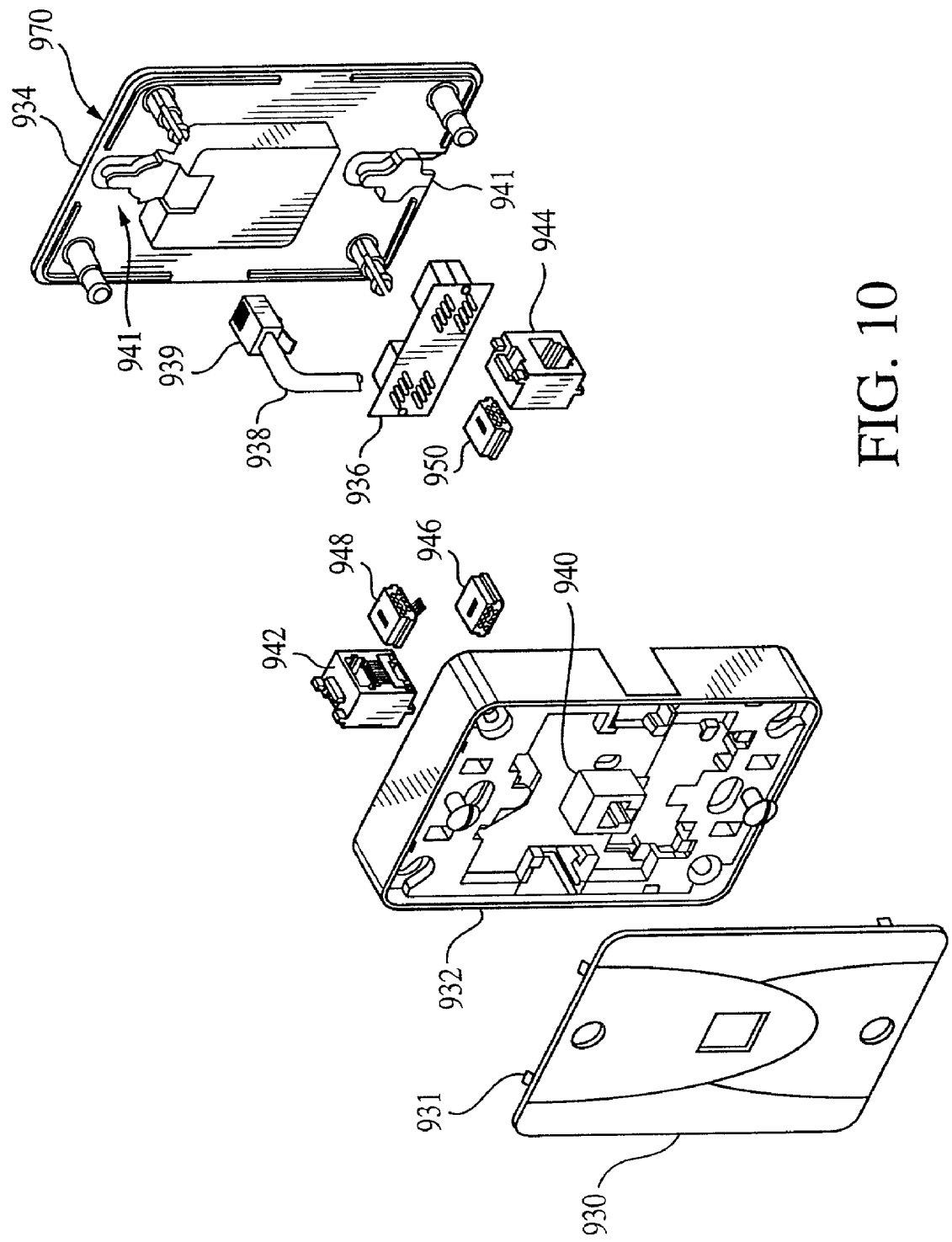
FIG. 10 is an exploded perspective view of the wall mounted filter assembly of FIGS. 8–9c.

Referring now to FIGS. 8–10*b*, the fixed (e.g., wall mounted) variant of the signal conditioning device of invention is now described. FIG. 8 is a functional block and wiring diagram for one exemplary embodiment of the device 800. In this embodiment, the signal conditioning (e.g., filter) circuit 300 is disposed within a wall-mountable multi-part housing element 902. FIGS. 9*a*–*c* are front, side, and rear plan views of the exemplary wall mount device housing 902 and filter circuit 300. The illustrated embodiment comprises one primary "wall" jack 906, and two "side" jacks 908, 910 disposed on both the left and right side walls 912, 914 of the housing 902, each jack designed to receive a modular plug therein. The side jacks 908, 910 may be used for applications such as answering machines, ADSL, etc., as shown in FIG. 8. One of the side jacks 908 is allocated to an ADSL device, and is accordingly unfiltered in this embodiment. FIG. 10 is an exploded perspective view of the wall mounted filter assembly 800 of FIGS. 8–9*c*.

Figure 10A:
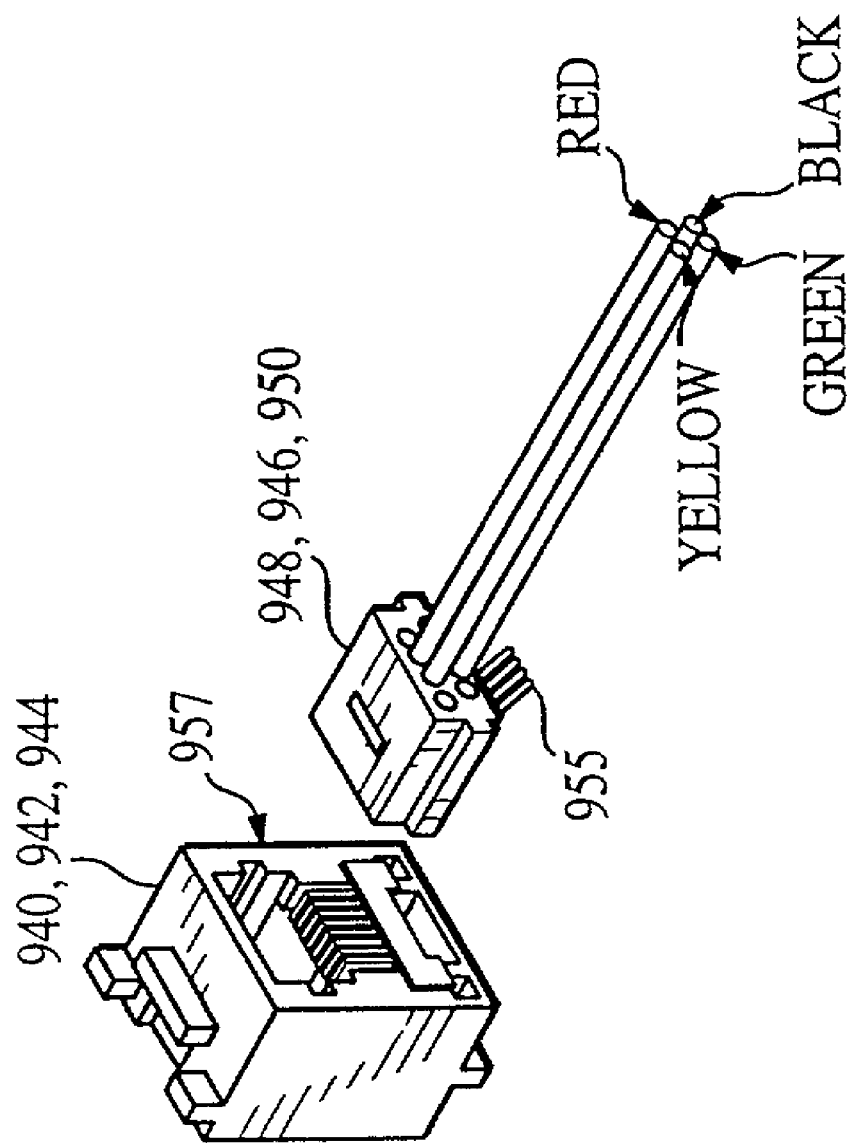
FIG. 10a is a perspective detail view of the wall mounted device housing of FIG. 10, illustrating the wiring arrangement for modular plugs used therewith.
Figure 10B:
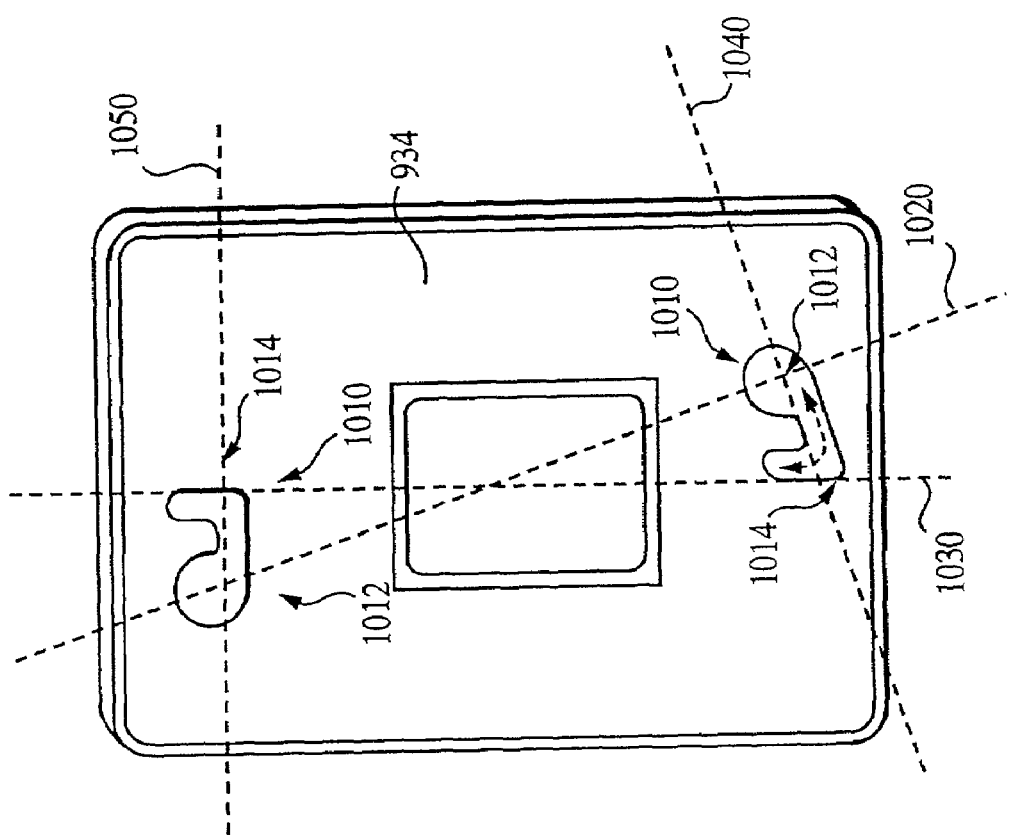
FIG. 10b is a front plan view of another embodiment of the mounting arrangement used in conjunction with the inner housing element of the wall mounted variant of the invention.

As best shown in FIGS. 10–10*a*, the fixed unit 800 comprises a housing 902 having a plurality of components, including a front face plate (optional) 930, outer housing element 932, inner housing element 934, component board 936, wall jack cable 938 with modular plug 939, jack housings 940, 942, 944, and associated jack inserts 946, 948, 950. The filter circuit components 300 are disposed on the component board 936, the latter being captured within the interior volume of the housing 902 when assembled. The individual conductors of the cable 938 are terminated to corresponding terminals on the board 936 (not shown) as previously described herein. As shown in FIG. 10*a*, the jack inserts 946, 948, 950 include a plurality of metallic conductor terminals which mate to the corresponding terminals 955 on any modular plug received in the jack housings 940, 942, 944, respectively. The terminals 955 are terminated to the interior wiring of the housing element via solder or other mechanism (e.g., crimping, splicing, etc) to form the wiring arrangement shown in FIG. 8. The terminated inserts 946, 948, 950 are then received within apertures 957 formed in their corresponding jack housings 940, 942, 944, as shown in FIG. 10*a*. The jack inserts and housings are in the illustrated embodiment formed from a polymer (e.g., plastic)

using an injection molding process, although other materials and formation techniques (such as transfer molding) can be used.

The housing inner element 934 is mounted to the wall or other surface using a post-and-slot arrangement 970 as shown in FIG. 10, although other types of mounting arrangements may be used alone or in conjunction. For example, screws can be used to mount the housing element 934 (and housing 902) to the wall/surface. Alternatively, the arrangement of FIG. 10b can be utilized, wherein a plurality of specially formed apertures 1010 are used to cooperate with a corresponding number (e.g., two) expanded head stud posts (not shown) mounted in vertical alignment on the wall/surface. Specifically, the housing element 934 is rotated clockwise such that the largest portions 1012 of the apertures 1010 are vertically aligned as well. The user then inserts the studs through the aperture portions 1012, such that the expanded heads are beyond the plane of the element 934. The user then rotates the element 934 counter-clockwise such that the shanks of the studs pass to the second portions 1014 of the apertures 1010 along axes 1040, 1050. At this point, the user then slides the element 934 vertically downward along axis 1030, engaging the studs within the vertical portions of the apertures and removably securing it to the wall.

Once the inner housing element 934 is mounted, the modular plug 939 is inserted into the existing wall jack, and the outer housing element 932 mounted thereon. Alternatively, the housing 902 can be completely assembled as shown in FIGS. 9a–9c, and the cable 938 and modular plug 939 routed to the wall jack and inserted therein. The user then simply places the device 900 over the studs such that the latter are received within the apertures 941 formed in the back of the inner housing element 934 (or those of FIG. 10b), and then slides the device 900 to engage the studs in the apertures.

It will be appreciated that the foregoing embodiments of "wall" mount circuits and housings are merely illustrative of the broader concepts of the invention. Hence, different circuit configurations than that of FIG. 8 may be used if desired. Similarly, alternate numbers and locations of the modular jacks shown in these embodiments may be employed.

Exemplary Applications

Figure 11:
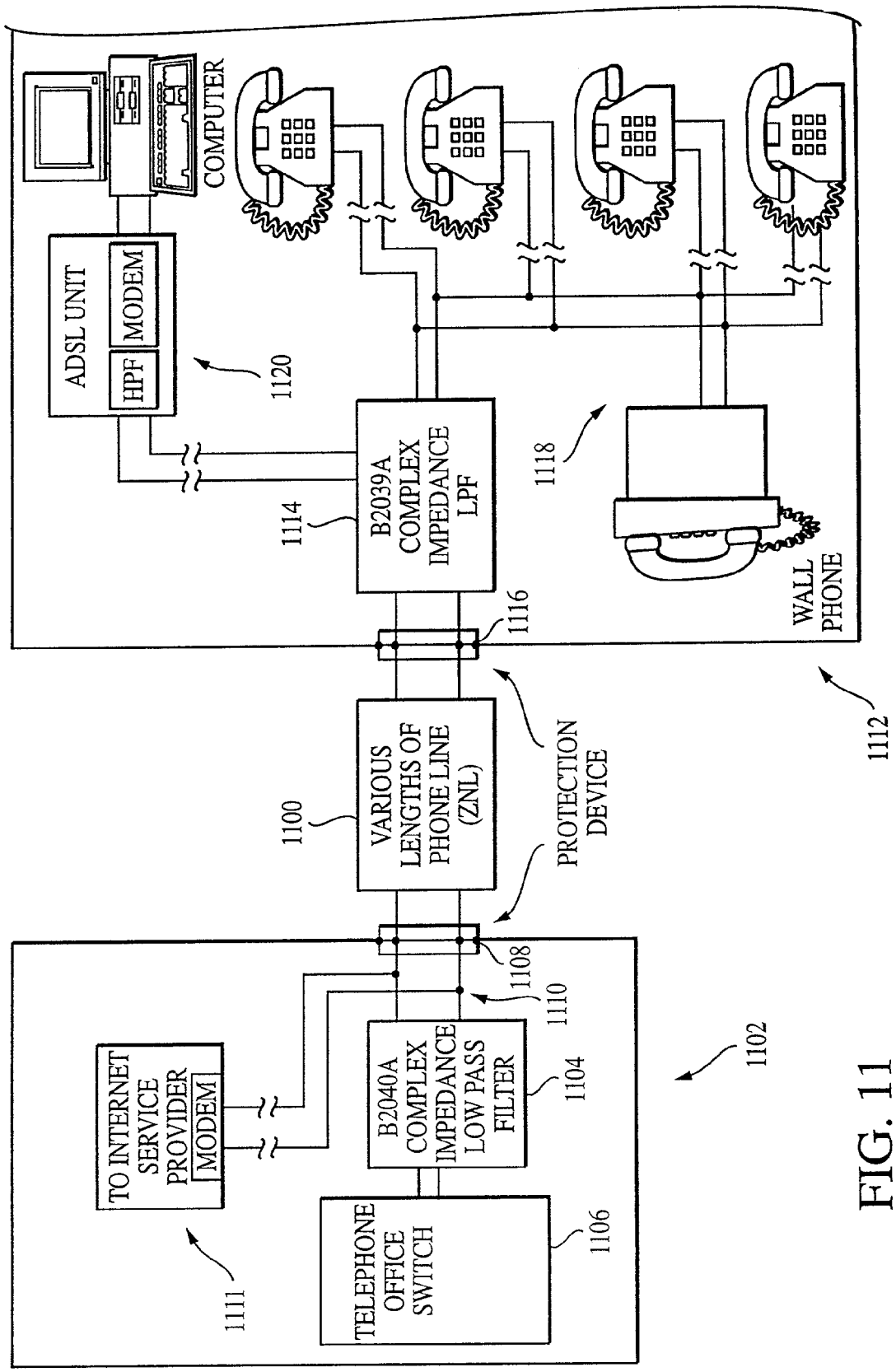
FIG. 11 is a logical block diagram illustrating one exemplary application of the signal conditioning circuit of the present invention.
Figure 12:
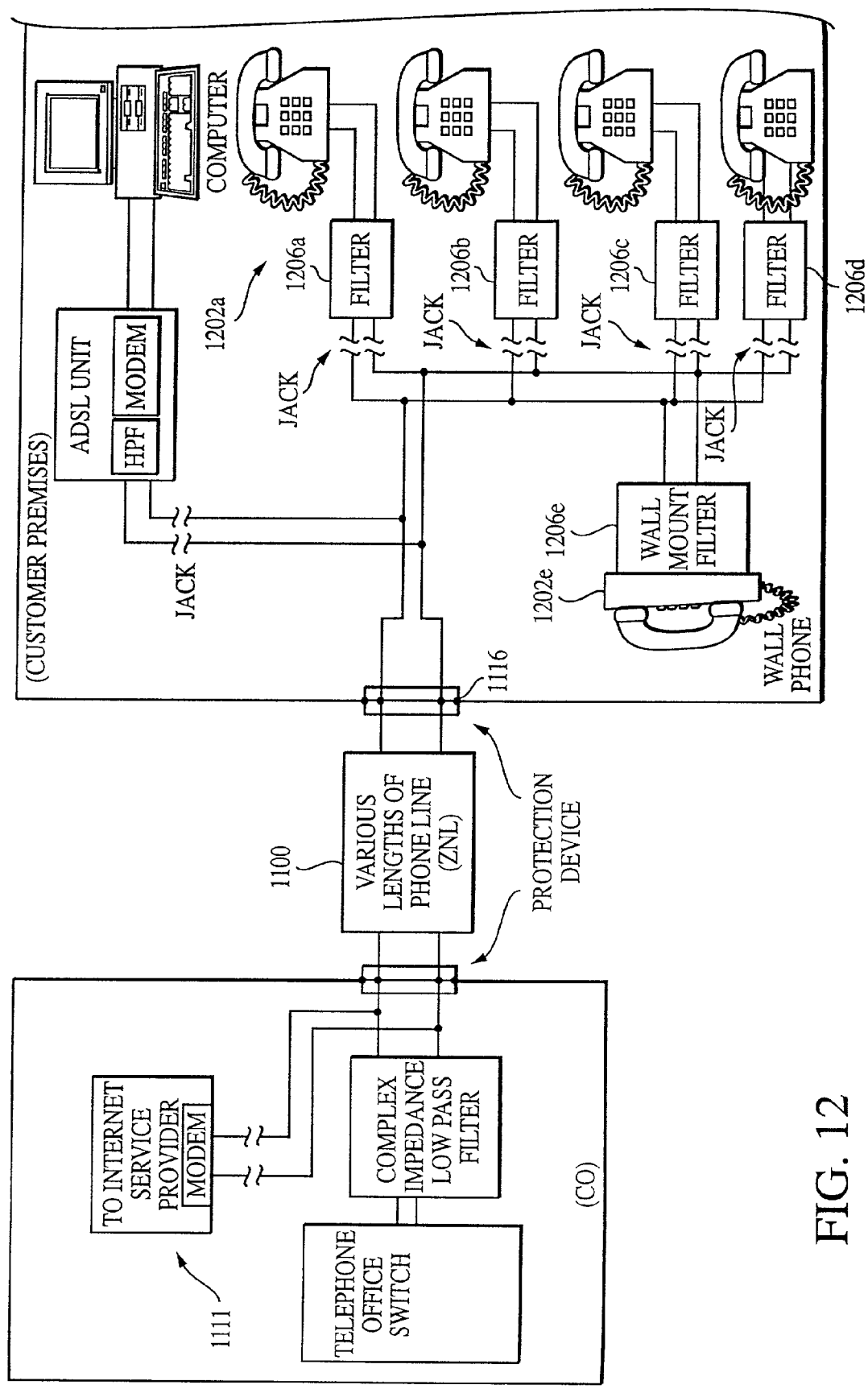
FIG. 12 is a logical block diagram illustrating another exemplary application of the signal conditioning circuit of the present invention.
Figure 12A:
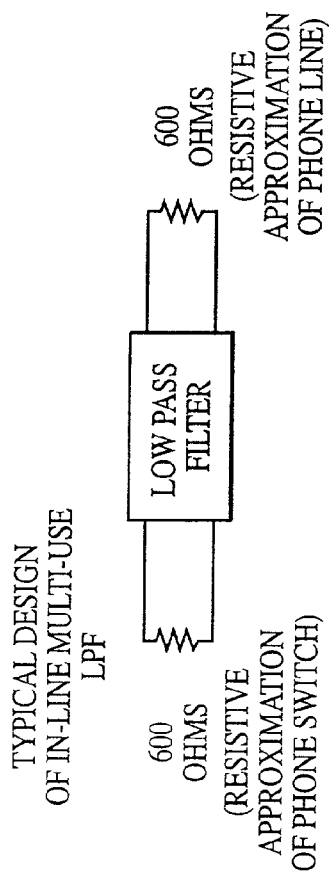
FIGS. 12a–b are block diagrams illustrating one exemplary embodiment of the complex modeling of the signal conditioning circuit of the present invention (as used in the application of FIG. 12) as compared to a typical prior art approach.
Figure 12B:
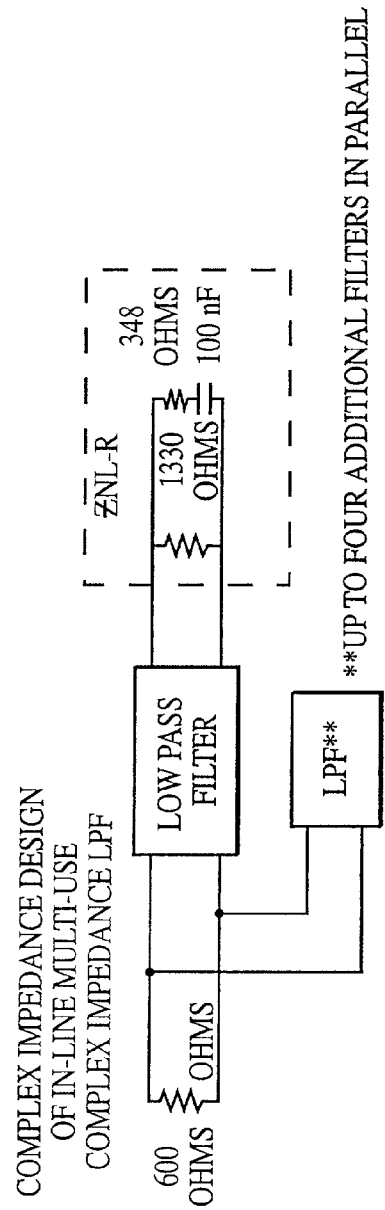

Referring now to FIGS. 11–12b, various applications of the signal conditioning circuit(s) of the present invention are illustrated. It will be recognized that the following applications are merely exemplary in nature, and that the signal conditioning devices of the present invention may be used in any number of different applications and configurations not limited to those discussed herein.

FIG. 11 is a logical block diagram illustrating one exemplary application of the signal conditioning circuit, wherein two complex-impedance low-pass filter circuits according to the invention are disposed on either side of a conventional (e.g., POTS) telephone line 1100. On the service provider side 1102, the filter circuit 1104 is disposed between the telephone central office (CO) switch 1106 and the service-provider side protection device 1108, before the tap 1110 for the ISP/modem 1111. On the customer side 1112, the filter circuit 1114 is disposed immediately after the customer side protection device 1116. The customer-side filter circuit 1114 of FIG. 11 comprises the three-jack variant of FIGS. 8–10b previously described. The customer-side filter 1114 provides service to the customer's telephone extensions 1118 (or similar devices), as well as filter "bypass" to their ADSL-equipped computer 1120.

FIGS. 11a–d illustrate in greater detail the relationship between configurations and methods for selecting filter components in the prior art and according to the current invention, respectively, in the context of the architecture of FIG. 11. Specifically, as shown in FIG. 11a, the prior art approach to filter component selection and impedance matching utilizes purely resistive approximations of the CO switch and phone line impedances. Commonly, tabulations of pre-calculated data are consulted, and components for the filter circuit selected based on the desired attenuation level and these resistive approximations. As shown in FIG. 11b, the present invention advantageously models, inter alia, the phone line impedance as a complex impedance (i.e., having both real and imaginary components) based on the inclusion of capacitive/inductive elements in the modeling process. In the illustrated embodiment, these real and imaginary components correspond to resistive and capacitive elements, respectively, although other arrangements (such as R-L-C, R-L, etc.) may clearly be used. The selection of filter circuit components is driven by the desired attenuation level as well as an optimization based on the complex impedance. The methods for accomplishing such complex impedance modeling are described in greater detail subsequently herein.

Figure 11C:
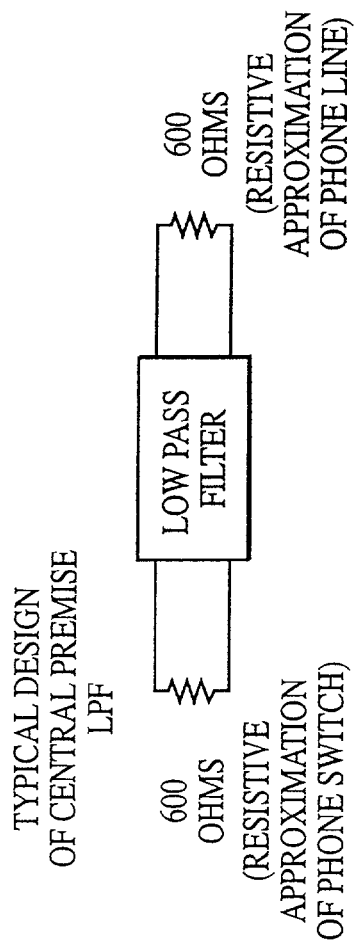
FIGS. 11c–d are block diagrams illustrating a second exemplary embodiment of the complex modeling of the signal conditioning circuit of the present invention (as used in the application of FIG. 11) as compared to a typical prior art approach.
Figure 11D:
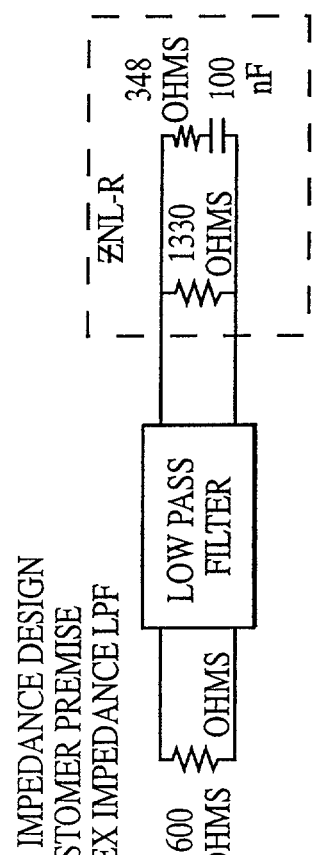

Similarly, FIGS. 11c–d illustrate the customer-side modeling and component selection processes under the prior art and the present invention, respectively.

FIG. 12 is a logical block diagram illustrating another exemplary application of the signal conditioning circuit of the present invention. In the arrangement of FIG. 12, each of the respective telephone extensions (or other similar devices) 1202a–e have their own corresponding in-line filters 1206a–e.

FIGS. 12a–b illustrate in greater detail the relationship between configurations and methods for selecting filter components in the prior art and according to the current invention, respectively, in the context of the architecture of FIG. 12. As with FIG. 11b previously described, the present invention advantageously models, inter alia, the phone line impedance as a complex based on the inclusion of capacitive/inductive elements in the modeling process.

Method of Manufacture

Figure 13:
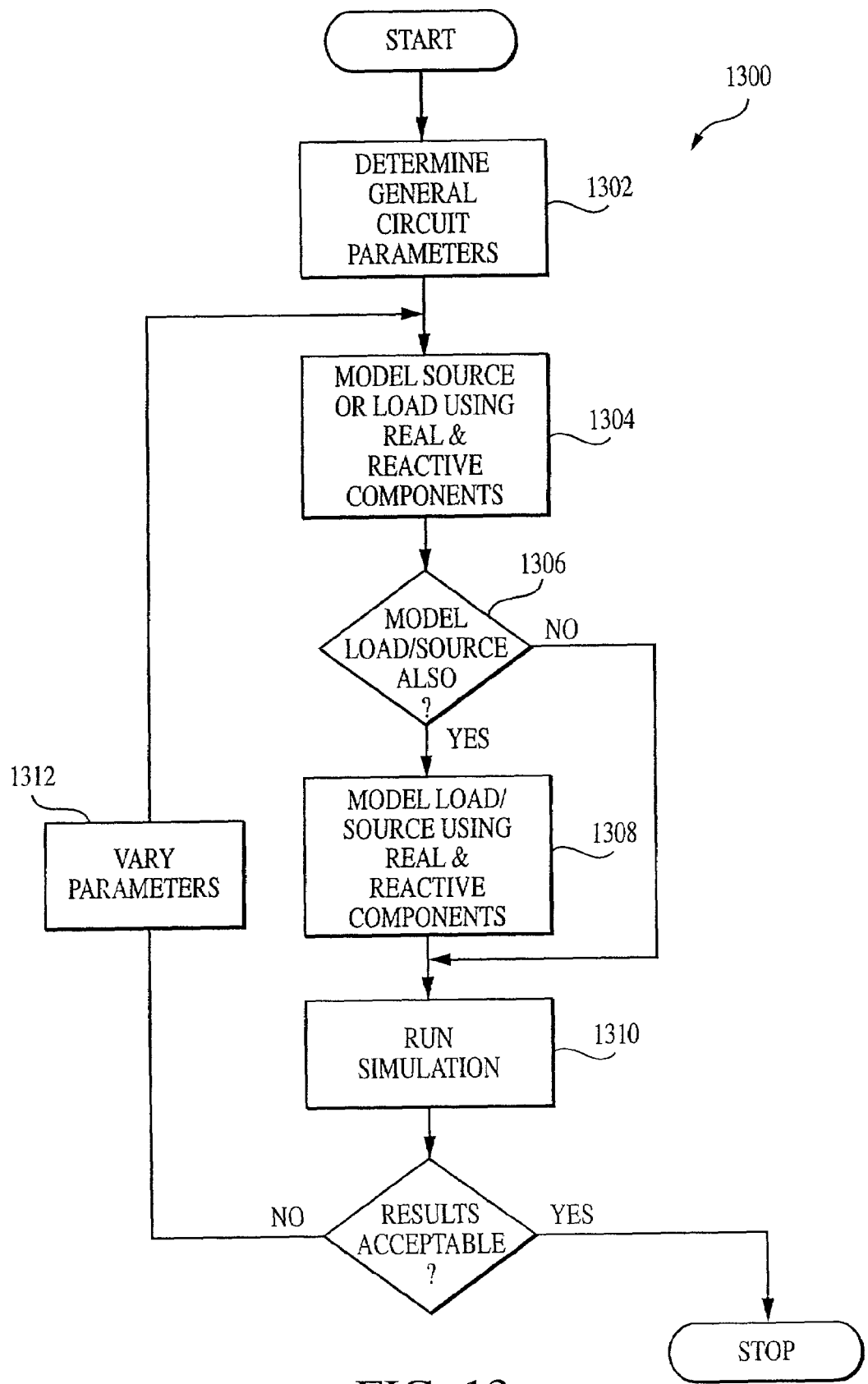
FIG. 13 is a logical flow diagram illustrating one exemplary embodiment of the method of manufacturing (designing) the circuit of the invention.
Figure 14:
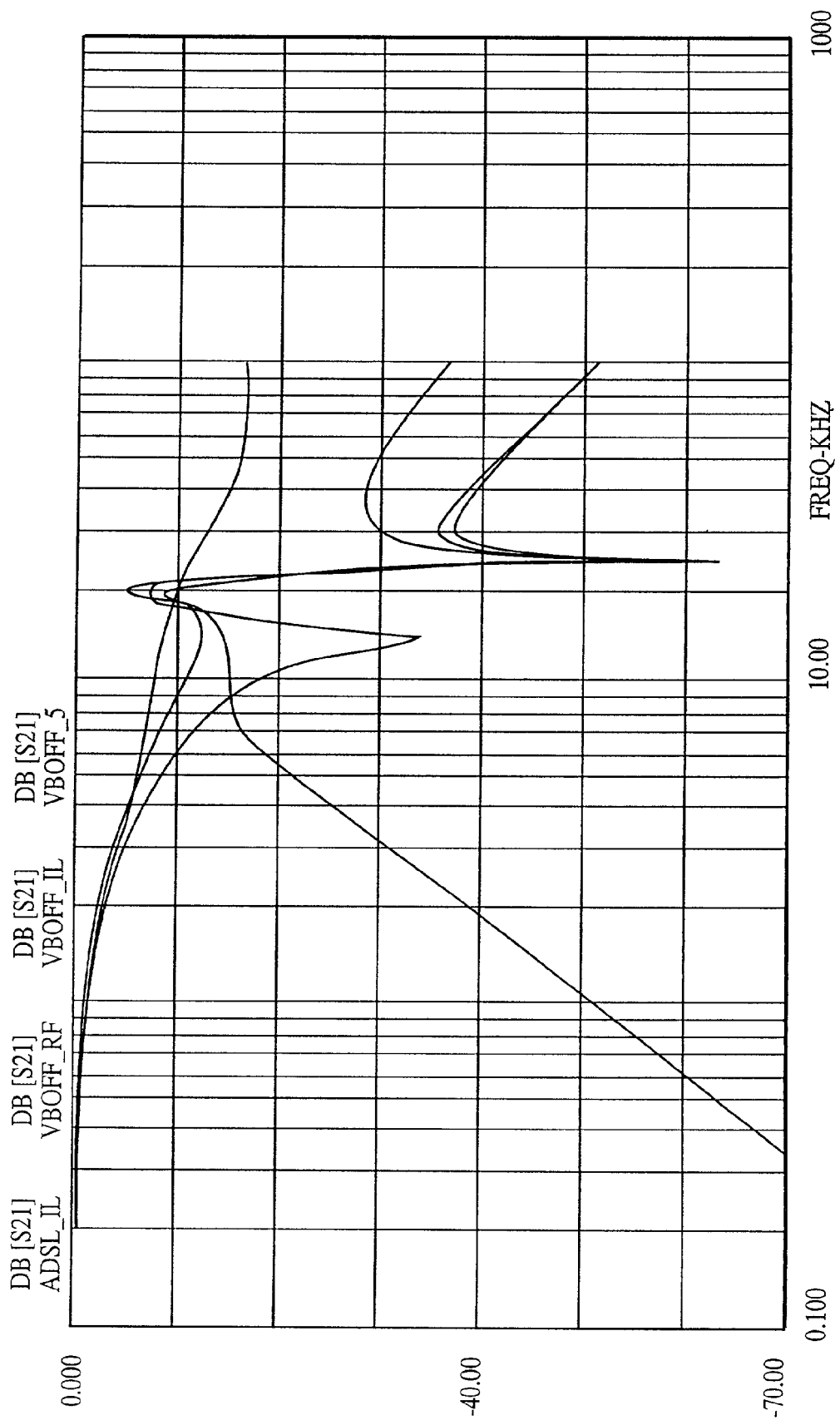
FIG. 14 is a graph illustrating the impedance versus frequency performance of the exemplary circuit modeled per the parameters and methodology of Appendix II.
Figure 15:
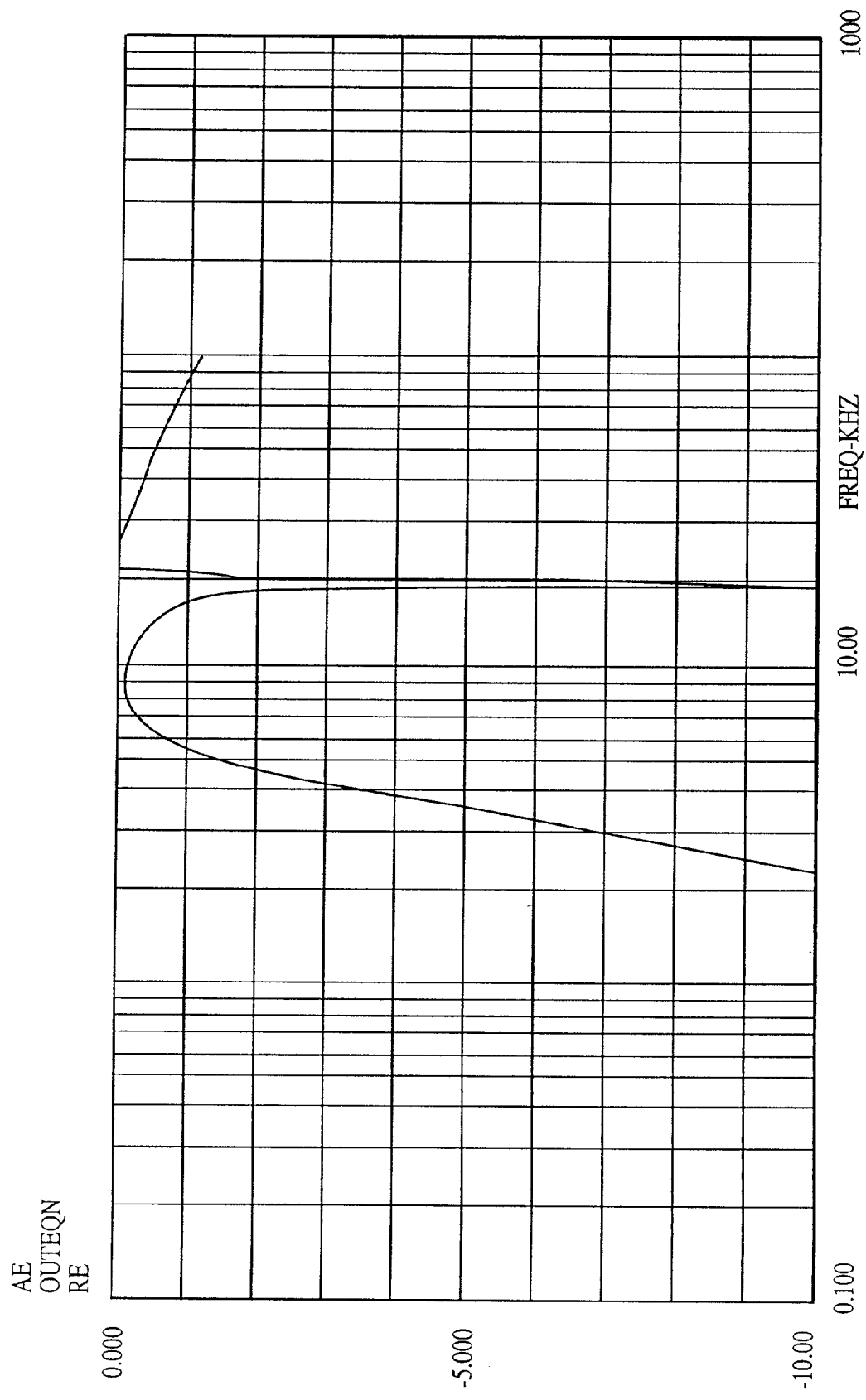
FIG. 15 is a graph illustrating the insertion loss versus frequency performance for the circuit described in Appendix II.

Referring now to FIGS. 13–15, the general method of manufacturing the aforementioned signal conditioning circuit is described in detail. It is noted that while the following description of the method of FIG. 13 is cast in terms of the complex modeling of portable assembly of FIGS. 1–7 using a computer modeling package (e.g., Touchstone™), the broader method of the invention is equally applicable to other configurations (e.g., the "wall mount" embodiment of FIG. 8) and other mechanisms for conducting the modeling set-up and calculations.

As shown in FIG. 13, the method 1300 generally comprises first determining the general circuit parameters associated with the intended application (step 1302). For example, if the intended application is to be compliant with the T1.421 In-Line Filter Standard previously discussed herein, frequency, voltage, current, and any other parameters compliant with such standard are specified. These parameters are effectively used to bound the resulting design configuration. For example, voice band signals shall be passed through the filter with no more than 3.25 dB attenuation and the impedance of the filter must match the associated circuitry with a return loss value of −3 dB or better. At the same time, the filter must attenuate high band frequencies at least 21 dB.

Next, in step 1304, the load (or source) to be used for the intended application is modeled in terms of both real (resistive) and imaginary (reactive) components. This approach allows for a more accurate modeling of true load/source electrical performance, and resulting synthesis of the final design. Specifically, in the simple case of a customer-premises copper telephone wire, such telephone wire can be modeled as a first resistor (e.g., 1330 Ω) in electrical parallel with a second resistor (e.g., 348 Ω) and a capacitor (e.g., 100 nF) in series, as shown in FIG. 11d. As the load/source applications become more complex, however, more complex equivalent circuits can be utilized to accurately model the impedance response of the load/source.

Note that prior art approaches (e.g., so-called "Butterworth" filter tables) utilize generally only the real or resistive components associated with the load/source, thereby detracting from their accuracy. Such tabular values may be used as a starting point for the parameters of the present invention if desired, but are not required, as the method set forth herein (iteratively) calculates such values.

Herein lies one of the significant advantages of the invention, in that through use of complex-impedance modeling as described, the performance of the resulting conditioning circuit design over a broad range of frequencies can be evaluated. This is in contrast with prior art techniques, wherein resistive modeling does not afford the insight into circuit performance over the broad frequency range that complex modeling does.

In the case of the computer modeling software previously referenced, the designer must also format and code the information in order to facilitate the iterative calculations subsequently performed. Specifically, this formatting and coding comprises (i) generating a schematic of the "target" circuit (here, the exemplary in-line signal conditioning circuit) and any associated source and/or load being modeled; (ii) performing a node analysis of the generated schematic to identify node numbers; and (iii) coding the schematic node numbers identified in (ii) for use by the modeling software. See Appendix II hereto, which provides an exemplary file listing code and parameters (Touchstone format) used in modeling the in-line filter previously described herein, specifically adapted for T1.421 Standard compliance.

If the designer also wishes to model a source (or load) in addition to the load/source previously modeled per step 1304, this is accomplished per steps 1306 and 1308. Note that in the exemplary computer program embodiment described below, a plurality of different parameters can be simultaneously modeled, thereby advantageously providing the highest degree of accuracy in the results of the simulation. This is particularly useful in that the subsequent or "piece-meal" addition of loads and sources (i.e. various ANSI and CSA phoneline loops and bridged taps) for a filter can produce less than optimal results; by modeling the filter and load and source together (the latter as complex impedances), the resulting filter configuration will produce the best level of performance and be highly optimized for the intended application across the entire frequency range of interest.

After the desired load/source components are modeled in steps 1304–1308, the user runs a simulation/calculation using, e.g., a computer program to generate the desired design and associated component values. (step 1310). Any number of commercially available circuit synthesis and modeling software packages may be used to implement the foregoing methods efficiently. For example the well-known Agilent Touchstone™/EEsof EDA, or Eagleware™ programs offered by Eagleware Corporation can be utilized. Alternatively, the Voltaire XL/LS simulator manufactured by Applied Wave Research can be used.

FIG. 14 herein illustrates the impedance versus frequency performance of the exemplary circuit modeled per the parameters and methodology of Appendix II. Negative S11 values indicate that more of the signal is reaching the load than is being reflected back to the source. Modeling a resistive filter would produce positive, reflective values in the plot. FIG. 15 shows the insertion loss versus frequency performance where a value of at least 21 dB is required at 25 kHz and higher.

Alternatively, while less optimal, hand calculation or iteration can be utilized to practice the foregoing design methodology if desired.

If the results of the simulation/synthesis are acceptable and optimized to the desired degree (e.g., including compliance with the required specifications), the process is terminated. If not, various of the input parameters are incrementally varied (step 1312), and the process repeated. Accordingly, the process of the present invention is generally iterative in nature, such iteration providing optimization.

When using Touchstone or similar package, the software may be configured to incrementally vary one or more of these parameters; however, this approach may result in hitting so-called "dead ends", in that the programs are in certain circumstances not sophisticated enough to identify a direction of parameter variation which will produce the desired result. In this capacity, the designer's knowledge and input are often critical to achieving the desired level of performance.

The methodology of the present invention also utilizes the step of screening or evaluating the design based on manufacturing cost considerations. Specifically, if cost is a constraint (which it almost always is), the designer must also consider the most cost-effective and reliable way of providing the resistance, inductance, and capacitance values obtained from the foregoing modeling methods. For example, it may only be possible to use a shaped-core inductor to provide a certain required combination of inductance, impedance, and withstand voltage as specified by the design process; hence, the designer's choices are limited. However, if the required parameters can be met through use of either a shaped core or a micro-gapped toroid core (such as that previously described herein), the latter having a significantly lower cost, then the designer obviously should choose the gapped core toroid (unless other unrelated considerations such as availability prevail). Hence, the methodology 1300 of the present invention inherently includes an additional layer of cost consideration and/or availability as part of the design and component selection processes.

After the filter design has been determined and optimized, it is fabricated and disposed within the portable housing element as previously described. The device is then assembled and tested electrically.

It will be recognized that other components may be used in conjunction with the invention(s) as described herein. For example, one or more light sources (e.g., light emitting diodes) may be disposed within the circuit and/or housings, or even within the connectors themselves, in order to provide visual indication of one or more parameters associated with the operation of the circuit(s) or equipment to which the circuit is electrically connected. Additionally, electronic noise shielding of the type well known in the electronic arts may be disposed in or around the portable device housing and/or fixed device housing in order to suppress internally or externally generated electronic noise (e.g., EMI).

Furthermore, various types of connectors may be used consistent with the invention. For example, connectors having magnetics or other electrical components associated therewith may be used in conjunction with the signal conditioning components of the circuit described herein. Furthermore, various connector internal component and lead arrangements may be used, such as the interlock base assembly manufactured by the Assignee hereof may be used. It will also be recognized that positioning or retaining elements (e.g., "contour" elements, as described in U.S. Pat. No. 6,116,963 entitled "Two Piece Microelectronic Connector and Method" issued Sep. 12, 2000, and assigned to the Assignee hereof) may optionally be utilized as part of the connector(s) of the present invention.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

APPENDIX I

© Copyright 2001–2002 Pulse Engineering, Inc. All rights reserved.

1. DC Resistance
Reference: T1E1 4/2001-007R0 Section 4.1

|  | MAX | B8004 |
|---|---|---|
| DC Resistance | 25 Ohms | 15.7 |
| COMPLIANT: Y/N (YES OR NO) |  | Y |

2. ON-HOOK VOICE BAND FREQUENCY RESPONSE
Reference: T1E1 4/2001-007R0 Section 5, 5.1, 5.2 and 5.3

|  | Frequency | MAX | MIN | B8004 |
|---|---|---|---|---|
| Single Filter | 1 kHz (Ref) | 1.5 dB | −0.5 dB | 0.28 |
|  | 200 Hz | (Ref) + 1.5 dB | (Ref) − 1.5 dB | 0.03 |
|  | 2.8 kHz | (Ref) + 1.5 dB | (Ref) − 1.5 dB | 0.16 |
| 5 Filters | 1 kHz (Ref) | 6.5 dB | −1.0 dB | 1.67 |
|  | 200 Hz | (Ref) + 2.0 dB | (Ref) − 4.0 dB | 0.14 |
|  | 2.8 kHz | (Ref) + 2.0 dB | (Ref) − 2.0 dB | 2.26 |
| COMPLIANT: Y/N (YES OR NO) |  |  |  | Y |
| Envelope Delay Distortion: |  |  |  |  |
| Single Filter | 200 Hz | 250 uSec |  | 62.00 |
|  | 1.0 kHz | 250 uSec |  | 1.00 |
|  | 2.8 kHz | 250 uSec |  | 4.20 |
| COMPLIANT: Y/N (YES OR NO) |  |  |  | Y |

APPENDIX I-continued

© Copyright 2001–2002 Pulse Engineering, Inc. All rights reserved.

3. OFF-HOOK VOICE BAND FREQUENCY RESPONSE
Reference: T1E1 4/2001-007R0 Section 6.1, 6.2 and 6.5

|  | Frequency | MAX | MIN | B8004 |
|---|---|---|---|---|
| Single Filter | 1 kHz (Ref) | 0.5 dB | −0.5 dB | −0.13 |
| 7 mA | 200 Hz | (Ref) + 0.5 dB | (Ref) − 1.0 dB | 0.07 |
|  | 3.4 kHz | (Ref) + 1.0 dB | (Ref) − 1.5 dB | −0.18 |
|  | 4.0 kHz | (Ref) + 1.0 dB | (Ref) − 1.5 dB | 0.01 |
| Single Filter | 1 kHz (Ref) | 0.5 dB | −0.5 dB | −0.04 |
| 90 mA | 200 Hz | (Ref) + 0.5 dB | (Ref) − 1.0 dB | 0.14 |
|  | 3.4 kHz | (Ref) + 1.0 dB | (Ref) − 1.5 dB | −0.11 |
|  | 4.0 kHz | (Ref) + 1.0 dB | (Ref) − 1.5 dB | 0.03 |
| 5 Filters | 1 kHz (Ref) | 1.0 dB | −1.0 dB | 0.13 |
| 7 mA | 200 Hz | (Ref) + 2.5 dB | (Ref) − 1.5 dB | 0.07 |
|  | 3.4 kHz | (Ref) + 3.25 dB | (Ref) − 2.0 dB | 1.13 |
|  | 4.0 kHz | (Ref) + 3.25 dB | (Ref) − 2.0 dB | 1.56 |
| 5 Filters | 1 kHz (Ref) | 1.0 dB | −1.0 dB | 0.10 |
| 90 mA | 200 Hz | (Ref) + 2.5 dB | (Ref) − 1.5 dB | 0.06 |
|  | 3.4 kHz | (Ref) + 3.25 dB | (Ref) − 2.0 dB | 1.18 |
|  | 4.0 kHz | (Ref) + 3.25 dB | (Ref) − 2.0 dB | 1.56 |
| COMPLIANT: Y/N (YES OR NO) |  |  |  | Y |
| Envelope Delay Distortion: |  |  |  |  |
| Single Filter | 200 Hz | 250 uSec |  | 33.00 |
|  | 1.0 kHz | 250 uSec |  | 35.00 |
|  | 3.4 kHz | 250 uSec |  | 30.00 |
|  | 4.0 kHz | 250 uSec |  | 30.00 |
| COMPLIANT: Y/N (YES OR NO) |  |  |  | Y |

4. OFF-HOOK VOICE BAND IMPEDANCE DISTORTION
(NETWORK AND PHONE)
Reference: T1E1 4/2001-007R0 Section 6.3, 6.3.1 and 6.3.2

|  | Frequency | MAX | MIN | B8004 |
|---|---|---|---|---|
| PHONE |  |  |  |  |
| Single Filter | 200 Hz |  | −13.0 dB | −47 |
| 7 mA | 600 Hz |  | −13.0 dB | −36.5 |
|  | 1 kHz |  | −9.0 dB | −26.8 |
|  | 2.2 kHz |  | −9.0 dB | −12.2 |
|  | 3.4 kHz |  | −2.0 dB | −2.2 |
| Single Filter | 200 Hz |  | −13.0 dB | −29.1 |
| 90 mA | 600 Hz |  | −13.0 dB | −46 |
|  | 1 kHz |  | −9.0 dB | −29.2 |
|  | 2.2 kHz |  | −9.0 dB | −13.7 |
|  | 3.4 kHz |  | −2.0 dB | −3.8 |
| 5 Filters | 200 Hz |  | −13.0 dB | −32 |
| 7 mA | 600 Hz |  | −13.0 dB | −22.1 |
|  | 1 kHz |  | −9.0 dB | −17.7 |
|  | 2.2 kHz |  | −9.0 dB | −10.3 |
|  | 3.4 kHz |  | −2.0 dB | −2.7 |
| 5 Filters | 200 Hz |  | −13.0 dB | −23.4 |
| 90 mA | 600 Hz |  | −13.0 dB | −19.4 |
|  | 1 kHz |  | −9.0 dB | −17.5 |
|  | 2.2 kHz |  | −9.0 dB | −11.2 |
|  | 3.4 kHz |  | −2.0 dB | −41 |
| NETWORK |  |  |  |  |
| Single Filter | 200 Hz |  | −12.0 dB | −28.5 |
| 7 mA | 600 Hz |  | −12.0 dB | −25.5 |
|  | 1 kHz |  | −10.0 dB | −21.5 |
|  | 2.2 kHz |  | −10.0 dB | −15 |
|  | 3.4 kHz |  | −5.0 dB | −11.5 |
| Single Filter | 200 Hz |  | −12.0 dB | −23.70 |
| 90 mA | 600 Hz |  | −12.0 dB | −23.30 |
|  | 1 kHz |  | −10.0 dB | −21.50 |
|  | 2.2 kHz |  | −10.0 dB | −16.00 |
|  | 3.4 kHz |  | −5.0 dB | −12.60 |
| 5 Filters | 200 Hz |  | −12.0 dB | 34.10 |
| 7 mA | 600 Hz |  | −12.0 dB | −45.20 |
|  | 1 kHz |  | −10.0 dB | −43.80 |
|  | 2.2 kHz |  | −10.0 dB | −22.90 |
|  | 3.4 kHz |  | −5.0 dB | −14.60 |
| 5 Filters | 200 Hz |  | −12.0 dB | −26.90 |
| 90 mA | 600 Hz |  | −12.0 dB | −28.60 |

APPENDIX I-continued

© Copyright 2001–2002 Pulse Engineering, Inc. All rights reserved.

|  | | | |
|---|---|---|---|
| 1 kHz | | −10.0 dB | −33.30 |
| 2.2 kHz | | −10.0 dB | −26.90 |
| 3.4 kHz | | −5.0 dB | −16.40 |
| COMPLIANT: Y/N (YES OR NO) | | | Y |

5. OFF-HOOK VOICE BAND INTERMODULATION DISTORTION
Reference: T1E1 4/2001-007R0 Section 6.4

| | Frequency | MAX | MIN | B8004 |
|---|---|---|---|---|
| Tone 1 | 350 Hz | | −9 dBm | −35 dB |
| 1st Harm. | 700 Hz | −57 dB down | | −120 |
| 2nd Harm. | 1050 Hz | −60 dB down | | −120 |
| Tone 2 | 700 Hz | | −9 dBm | −40 dB |
| 1st Harm. | 1400 Hz | −57 dB down | | −130 |
| 2nd Harm. | 2100 Hz | −60 dB down | | −130 |
| Tone 3 | 1300 Hz | | −9 dBm | −60 dB |
| 1st Harm. | 2600 Hz | −57 dB down | | −130 |
| 2nd Harm. | 3900 Hz | −60 dB down | | −130 |
| Tone 4 | 1 kHz (Ref) | | −9 dBm | −70 dB |
| 1st Harm. | 200 Hz | −57 dB down | | −135 |
| 2nd Harm. | 3.4 kHz | −60 dB down | | −135 |
| COMPLIANT: Y/N (YES OR NO) | | | | ? |

6. OFF-HOOK TRANSVERSE BALANCE
Reference: T1E1 4/2001-007R0 Section 6.6

| | Frequency | MIN | B8004 |
|---|---|---|---|
| Single Filter | 200 Hz to 1 kHz | 40 dB | 65 |
| 7 mA | 1 kHz to 12 kHz | 40 dB | 69 |
| | 12 kHz to 1.544 MHz | 35 dB | 38 |
| | 1.544 MHz to 10 MHz | 30 dB | 47 |
| Single Filter | 200 Hz to 1 kHz | 40 dB | 50 |
| 90 mA | 1 kHz to 12 kHz | 40 dB | 56 |
| | 12 kHz to 1.544 MHz | 35 dB | 38 |
| | 1.544 MHz to 10 MHz | 30 dB | 47 |
| 5 Filters | 200 Hz to 1 kHz | 40 dB | 68 |
| 7 mA | 1 kHz to 12 kHz | 40 dB | 54 |
| | 12 kHz to 1.544 MHz | 35 dB | 36 |
| | 1.544 MHz to 10 MHz | 30 dB | 40 |
| 5 Filters | 200 Hz to 1 kHz | 40 dB | 65 |
| 90 mA | 1 kHz to 12 kHz | 40 dB | 54 |
| | 12 kHz to 1.544 MHz | 35 dB | 36 |
| | 1.544 MHz to 10 MHz | 30 dB | 40 |
| COMPLIANT: Y/N (YES OR NO) | | | Y |

7. OFF-HOOK HIGH BAND STOPBAND ATTENUATION
Reference: T1E1 4/2001-007R0 Section 7.2

| | Frequency | MIN | B8004 |
|---|---|---|---|
| Single Filter | 25 kHz to 50 kHz | 21 dB | 25.1 |
| 7 mA | 50 kHz to 10 MHz | 25 dB | 26.4 |
| Single Filter | 25 kHz to 50 kHz | 21 dB | 23.8 |
| 90 mA | 50 kHz to 10 MHz | 25 dB | 25.2 |
| 5 Filters | 25 kHz to 50 kHz | 21 dB | 24.7 |
| 7 mA | 50 kHz to 10 MHz | 25 dB | 26.1 |
| 5 Filters | 25 kHz to 50 kHz | 21 dB | 23.4 |
| 90 mA | 50 kHz to 10 MHz | 25 dB | 25.0 |
| COMPLIANT: Y/N (YES OR NO) | | | Y |

8. OFF-HOOK HIGH BAND BRIDGING LOSS
Reference: T1E1 4/2001-007R0 Section 7.3

| | Frequency | MAX | B8004 |
|---|---|---|---|
| Single Filter | 25 kHz to 1.2 MHz | 0.50 | −0.5 |
| 7 mA | 1.2 MHz to 10 MHz | 3.00 | −0.5 |
| Single Filter | 25 kHz to 1.2 MHz | 0.50 | −0.50 |
| 90 mA | 1.2 MHz to 10 MHz | 3.00 | −0.50 |
| 5 Filters | 25 kHz to 1.2 MHz | 1.25 | −0.60 |
| 7 mA | 1.2 MHz to 10 MHz | 4.00 | 1.10 |
| 5 Filters | 25 kHz to 1.2 MHz | 1.25 | −0.60 |
| 90 mA | 1.2 MHz to 10 MHz | 4.00 | 1.10 |
| COMPLIANT: Y/N (YES OR NO) | | | Y |

9. OFF HOOK ADSL INTER-MODULATION DISTORTION
Reference: T1E1 4/2001-007R0 Section 7.4.2, 7.4.3

| | Frequency | MAX | MIN | B8004 |
|---|---|---|---|---|
| Upstream | | | | |
| Tone 1 | 200 kHz | | | −1.65 dBm |
| Inter-Mod. | | | −103.65 dBm | |
| Tone 2 | 204.3125 kHz | | | −1.65 dBm |
| Inter-Mod. | | | −103.65 dBm | |
| Tone 3 | 300 kHz | | | −1.65 dBm |
| Inter-Mod. | | | −103.65 dBm | |
| Tone 4 | 304.3125 kHz | | | −1.65 dBm |
| Inter-Mod. | | | −103.65 dBm | |
| Downstream | | | | |
| Tone 1 | 25 kHz | | | −3.65 dBm |
| Inter-Mod. | | | −77.65 dBm | |
| Tone 2 | 29.3125 kHz | | | −3.65 dBm |
| Inter-Mod. | | | −77.65 dBm | |
| Tone 3 | 90 kHz | | | −3.65 dBm |
| Inter-Mod. | | | −77.65 dBm | |
| Tone 4 | 94.3125 kHz | | | −3.65 dBm |
| Inter-Mod. | | | −77.65 dBm | |

APPENDIX II

® Copyright 2001–2002 Pulse Engineering, Inc. All rights reserved.

```
! DESCRIPTION
! ----------------
! LINEAR CIRCUIT FILE FOR TOUCHSTONE. xDSL GROUP.
! 600 OHM/ZNL-r LOW PASS FILTER FOR ADSL/PHONE.
! PHIL GEFFE'S FILTER ANALYZED AND OPTIMIZED WITH
! REV 6 OF E1T1.4 IN-LINE FILTER SPECS.
DIM
    FREQ    KHZ
    RES     OH
    IND     MH
    CAP     UF
    LNG     MIL
    TIME    NS
    COND    /OH
    ANG     DEG
VAR
    LA      #2.75   3.3    3.63
    LB      #4.5    6.0    6.5
    CA      #.0114  0.012  .0126
    CB      #.09    0.010  .011
CKT
    !zhp-r
    CAP     1 2         C=.056
    CAP     3 4         C=.056
    RES     2 4         R=100
    IND     2 4         L=.470
    DEF2P   1 3         ZHPR
    !filter
    IND     2 4         L^LA    !2.25  LA
    CAP     2 4         C^CA    !.01   CA
    IND     3 5         L^LA    !2.25  LA
    CAP     3 5         C^CA    !.01   CA
    CAP     4 5         C^CB    !.0033 CB
    IND     4 6         L^LB    !6.1   LB
    IND     5 7         L^LB    !6.1   LB
    DEF4P   2 6 3 7     LPF
    !filter for paralleling
    IND     2 4         L^LB
    IND     3 5         L^LB
    CAP     4 5         C^CB
    IND     4 6         L^LA
    CAP     5 7         C^CA
    IND     5 7         L^LA
```

APPENDIX II-continued

® Copyright 2001–2002 Pulse Engineering, Inc. All rights reserved.

```
RES          6 7         R=5000000
CAP          6 7         C=.001
DEF2P        2 3         PARFIL
!filter backwards
IND          2 4         L^LB
IND          3 5         L^LB
CAP          4 5         C^CB
CAP          4 6         C^CA
IND          4 6         L^LA
CAP          5 7         C^CA
IND          5 7         L^LA
DEF4P        2 6 3 7     FPL
!filter and ckt for VB ONHOOK I/L
!XFER        1 2 0 3     N=.289
!ZNLBAL      2 4 3 5
!ZHPR        4 5
!FPL         4 6 5 7
!PARFIL      4 5
!PARFIL      4 5
!PARFIL      4 5
!PARFIL      4 5
!RES         6 7         R=5E6
!CAP         6 7         C=.001
!XFER        6 10 7 0    N=100
!DEF2P       1 10        VBON_IL
!REF for VB ONHOOK I/L
!XFER        1 4 0 5     N=.289
!ZHPR        4 5
!CAP         4 6         C=.1
!RES         6 5         R=348
!RES         4 5         R=1330
!XFER        4 10 5 0    N=5.1575
!DEF2P       1 10        VBONREF
!filter and ckt for VB OFFHOOK I/L
XFER         1 2 0 3     N=.194
ZHPR         2 3
CAP          2 6         C=.1
RES          6 3         R=348
FPL          2 4 3 5
XFER         4 10 5 0    N=3.464
DEF2P        1 10        VBOFF_IL
!5 filterS and ckt for VB OFFHOOK I/L
XFER         1 2 0 3     N=.194
ZHPR         2 3
CAP          2 6         C=.1
RES          6 3         R=348
FPL          2 4 3 5
PARFIL       2 3
PARFIL       2 3
PARFIL       2 3
PARFIL       2 3
XFER         4 10 5 0    N=3.464
DEF2P        1 10        VBOFF_5
!REF CKT for VB OFFHOOK I/L
XFER         1 2 0 3     N=.194
ZHPR         2 3
CAP          2 6         C=.1
RES          6 3         R=348
XFER         2 10 3 0    N=3.464
DEF2P        1 10        VBOFF_RF
!filter and ckt to be impedance analyzed
LPF          1 3 2 4
!PARFIL      3 4
!PARFIL      3 4
!PARFIL      3 4
ZHPR         3 4
RES          3 4         R=1330
RES          3 5         R=348
CAP          5 4         C=.1
DEF2P        1 2         ZDIST
!ref FOR ZDIST
RES          1 2         R=1330
RES          1 3         R=348
CAP          3 2         C=.1
DEF2P        1 2         ZDISTREF
!ADSL Insertion loss
```

APPENDIX II-continued

® Copyright 2001–2002 Pulse Engineering, Inc. All rights reserved.

```
XFER         1 2 0 3     N=0.707
IND          2 3         L=.470
CAP          2 4         C=.056
CAP          3 5         C=.056
FPL          4 6 5 7
XFER         6 10 7 0    N=3.464
DEF2P        1 10        ADSL_IL
!ADSL BRIDGING loss
XFER         1 2 0 3     N=0.707
IND          2 3         L=.470
CAP          2 4         C=.056
CAP          3 5         C=.056
FPL          4 6 5 7
!PARFIL      4 5
!PARFIL      4 5
!PARFIL      4 5
!PARFIL      4 5
RES          6 7         R=5E6
CAP          6 7         C=.001
XFER         4 10 5 0    N=1.414
DEF2P        1 10        ADSL_BL
FREQ
   SWEEP        .2  100  1
   STEP         1   2   4  30
OUTVAR
   X=ZDIST RE[Z1]
   Y=ZDIST IM[Z1]
   A=ZDISTREF RE[Z1]
   B=ZDISTREF IM[Z1]
OUTEQN
   NUM=A+J(B)−(X+J(Y))
   DEN=A+J(B)+(X+J(Y))
   AE=20*LOG(ABS(NUM/DEN))
YIELD
   TRACE        FAIL
   FREQ         1  3.4
   OUTEQN       RE[AE]    <−3.1
   !FREQ        .2  1
   !VBOFF_5     DB[S21]   <−1.75
   !FREQ        2  4
   !VBOFF_5     DB[S21]   <−7.0
   !FREQ        20  25
   !ADSL_IL     DB[S21]   >−30
   !FREQ        30  50
   !ADSL_IL     DB[S21]   >−28
   !FREQ        3.2  4
   !VBOFF_IL    DB[S21]   <−5.8
   !FREQ        40  1200
   !ADSL_BL     DB[S21]   <−1.5
OUT
   OUTEQN       RE[AE]    GR1
   ADSL_IL      DB[S21]   GR2
   VBOFF_RF     DB[S21]   GR2
   VBOFF_IL     DB[S21]   GR2
   VBOFF_5      DB[S21]   GR2
   ADSL_BL      DB[S21]   GR2
GRID
   LFREQ        .1  1000
   GR1          −10  0  1
   GR2          −70  0  10
```

What is claimed is:

1. A method, using a computer, of generating the design of a DSL filter circuit having a plurality of inductors and capacitors, comprising:

selecting a plurality of parameters relating to the performance of said circuit, said act of selecting comprising selecting said parameters such that (i) voice band signals are passed through said filter with no more than 3.25 dB attenuation; and (ii) the impedance of said filter comprises a return loss value of −3 dB or better;

modeling two external devices electrically coupled to said circuit each as a complex impedance;

selecting a first value for at least one of said plurality of inductors and capacitors;

performing a first simulation based on said selected first value and said modeled complex impedances; and evaluating the sufficiency of said design for said selected parameters.

2. The method of claim 1, wherein said act of selecting a plurality of parameters further comprises selecting such that said filter attenuates high band frequencies at least 21 dB.

3. A method, using a computer, of generating the design of a signal conditioning circuit having a plurality of electrical components, comprising:

selecting a plurality of parameters relating to the performance of said circuit, said act of selecting comprising selecting said parameters such that (i) voice band signals are passed through said filter with no more than 3.25 dB attenuation; and (ii) the impedance of said filter comprises a return loss value of −3 dB or better;

modeling at least one external device electrically coupled to said circuit as a complex impedance;

selecting a first value for at least one of said plurality of electrical components;

running a first simulation based on said selected value and said modeled complex impedance; and evaluating the sufficiency of said design against said selected parameters.

4. The method of claim 3, further comprising varying at least said first value, and running a second simulation based thereon, when said step of evaluating the sufficiency indicates that at least one of said selected parameters are not satisfied.

5. The method of claim 3, wherein said act of modeling comprises:

generating at least one schematic for said circuit and said at least one external device;

generating a plurality of nodes based on said at least one schematic;

generating a coding of said nodes; and running said coding on a computer.

6. The method of claim 5, wherein said act of generating at least one schematic comprises:

generating a first schematic of said circuit; and generating a second schematic of said at least one external device, said second schematic having at least one reactive component therein.

7. The method of claim 6, wherein said act of generating a coding comprises generating a software configuration file including descriptions of said nodes.

8. The method of claim 3, wherein said act of selecting a plurality of parameters further comprises selecting such that said filter attenuates high band frequencies at least 21 dB.

9. A digital subscriber line filter circuit having a plurality of electrical components, the design of said circuit being generated by the method comprising:

selecting a plurality of parameters relating to (i) the attenuation in both the voice and DSL bands and (ii) the impedance, of said circuit, wherein said act of selecting comprises selecting said parameters such that (i) voice band signals are passed through said filter with no more than 3.25 dB attenuation; and (ii) the impedance of said filter comprises a return loss value of −3 dB or better;

generating at least one schematic for said circuit and said at least one external device, said external device being modeled as a complex impedance;

generating a plurality of nodes based on said at least one schematic;

generating a coding of said nodes; and running a first simulation based on said nodes and said coding; and evaluating the sufficiency of said design against said selected parameters;

wherein at least a portion of said method is performed using a computer.

10. The method of claim 9, wherein said act of selecting a plurality of parameters further comprises selecting such that said filter attenuates high band frequencies at least 21 dB.

11. A method, using a computer, of generating the design of a T1.421-compliant DSL filter circuit having a plurality of electrical components, comprising:

selecting a plurality of parameters relating to the performance of said circuit such that (i) voice band signals are passed through said filter with no more than 3.25 dB attenuation; and (ii) the impedance of said filter comprises a return loss value of −3 dB or better;

modeling two external devices electrically coupled to said circuit each as a complex impedance;

selecting a first value for at least one of said plurality of electrical components;

performing a first simulation based on said selected value and said modeled complex impedances; and evaluating the sufficiency of said design for said selected parameters.

12. A method, using a computer, of generating the design of a DSL filter circuit having a plurality of inductive and capacitive components, and evaluating said design over frequencies ranging from the voice band to at least in excess of 20 kHz, the method comprising:

selecting a plurality of parameters relating to the performance of said circuit such that (i) voice band signals are passed through said filter with no more than 3.25 dB attenuation; and (ii) the impedance of said filter comprises a return loss value of −3 dB or better;

modeling at least one external device electrically coupled to said circuit as a complex impedance;

selecting a first value for at least one of said plurality of inductive and capacitive components;

running a first computerized simulation based on said selected first value and said modeled complex impedance;

evaluating the sufficiency of said design against said selected parameters over said range of frequencies;

where said design is not sufficient, selecting a second value for said at least one plurality of components;

running at least one subsequent computerized simulation based at least in part on said selected second value.

13. The method of claim 12, wherein said act of modeling comprises:

generating at least one schematic for said circuit and said at least one external device;

generating a plurality of nodes based on said at least one schematic;

generating a coding of said nodes; and running said coding on a computer.

14. The method of claim 13, wherein said act of generating at least one schematic comprises:

generating a first schematic of said circuit; and generating a second schematic of said at least one external device, said second schematic having at least one reactive component therein.

15. The method of claim 14, wherein said act of generating a coding comprises generating a software configuration file including descriptions of said nodes.

16. A method, using a computer, of generating the design of a DSL filter circuit having a plurality of induction means and capacitive means, comprising:
- a step for selecting a plurality of parameters relating to the performance of said circuit, said step for selecting comprising selecting said parameters such that (i) voice band signals are passed through said filter with no more than 3.25 dB attenuation; and (ii) the impedance of said filter comprises a return loss value of −3 dB or better;
- a step for modeling two external devices electrically coupled to said circuit each as a complex impedance;
- a step for selecting a first value for at least one of said plurality of inductors and capacitors;
- a step for performing a first simulation based on said selected value and said modeled complex impedances; and
- a step for evaluating the sufficiency of said design for said selected parameters.

17. A method, using a computer, of generating the design of a DSL filter circuit having a plurality of inductors and capacitors, comprising:
- selecting a plurality of parameters relating to the performance of said circuit such that voice band signals are passed through said filter with no more than 3.25 dB attenuation, and the impedance of said filter comprises a return loss value of −3 dB or better;
- modeling a plurality of external devices electrically coupled to said circuit each as a complex impedance;
- selecting a first value for at least one of said plurality of inductors and capacitors;
- performing a first simulation based on said selected firstvalue and said modeled complex impedances; and
- evaluating the sufficiency of said design for said selected parameters.

18. The method of claim 17, wherein said act of selecting a plurality of parameters further comprises selecting such that said filter attenuates high band frequencies at least 21 dB.

19. The method of claim 17, wherein said act of modeling comprises:
- generating at least one schematic for said circuit and at least one of said plurality of external devices;
- generating a plurality of nodes based on said at least one schematic;
- generating a coding of said nodes; and
- running said coding on a computer.

20. The method of claim 19, wherein said act of generating at least one schematic comprises:
- generating a first schematic of said circuit; and
- generating a second schematic of said at least one external device, said second schematic having at least one reactive component therein.

21. The method of claim 20, wherein said act of generating a coding comprises generating a software configuration file including descriptions of said nodes.

* * * * *

UNITED STATES PATENT AND TRADEMARK OFFICE
CERTIFICATE OF CORRECTION

PATENT NO. : 7,110,931 B2  
APPLICATION NO. : 10/096605  
DATED : September 19, 2006  
INVENTOR(S) : Glen Cotant Page 1 of 1

It is certified that error appears in the above-identified patent and that said Letters Patent is hereby corrected as shown below:

Cover Page, item:

"(75) Inventors:     Glen Cotant, Ramona, CA (US);
                     Russell L. Machado, San Diego, CA (US)"

Should Read:

-- (75) Inventors:   Glen Cotant, Ramona, CA (US) --

Signed and Sealed this

Twenty-second Day of July, 2008

JON W. DUDAS
*Director of the United States Patent and Trademark Office*